United States Patent
Lee et al.

(10) Patent No.: US 11,404,266 B2
(45) Date of Patent: Aug. 2, 2022

(54) SEMICONDUCTOR DEVICES INCLUDING A SUPPORT PATTERN ON A LOWER ELECTRODE STRUCTURE

(71) Applicant: Samsung Electronics Co., Ltd., Suwon-si (KR)

(72) Inventors: Hyun-Suk Lee, Suwon-si (KR); Jungoo Kang, Seoul (KR); Gihee Cho, Yongin-si (KR); Sanghyuck Ahn, Daegu (KR)

(73) Assignee: Samsung Electronics Co., Ltd.

( * ) Notice: Subject to any disclaimer, the term of this patent is extended or adjusted under 35 U.S.C. 154(b) by 184 days.

(21) Appl. No.: 16/853,796

(22) Filed: Apr. 21, 2020

(65) Prior Publication Data

US 2021/0066066 A1    Mar. 4, 2021

(30) Foreign Application Priority Data

Aug. 29, 2019    (KR) .................. 10-2019-0106808

(51) Int. Cl.
| | | |
|---|---|---|
| *H01L 21/02* | (2006.01) | |
| *H01L 21/302* | (2006.01) | |
| *H01L 21/12* | (2006.01) | |
| *H01L 21/768* | (2006.01) | |

(52) U.S. Cl.
CPC .......... *H01L 21/0228* (2013.01); *H01L 21/12* (2013.01); *H01L 21/302* (2013.01); *H01L 21/76885* (2013.01)

(58) Field of Classification Search
CPC ... H01L 21/0228; H01L 21/12; H01L 21/302; H01L 21/76885; H01L 27/10852; H01L 28/90; H01L 27/10805; H01L 27/10808; H01L 27/1085; H01L 21/02172; H01L 2924/01009; H01L 2924/01022; H01L 2924/01041; H01L 28/84; H01L 28/75; H01L 28/65; H01L 28/60

See application file for complete search history.

(56) References Cited

U.S. PATENT DOCUMENTS

| | | | |
|---|---|---|---|
| 5,789,303 | A | 8/1998 | Leung et al. |
| 8,835,274 | B2 | 9/2014 | Hu |
| 9,159,779 | B2 | 10/2015 | Kim et al. |
| 9,245,983 | B2 | 1/2016 | Yamazaki |
| 9,502,289 | B2 | 11/2016 | Haukka et al. |
| 9,773,861 | B2 | 9/2017 | Lee et al. |
| 9,981,286 | B2 | 5/2018 | Woodruff et al. |
| 9,997,591 | B2 | 6/2018 | Lee et al. |
| 10,014,212 | B2 | 7/2018 | Chen et al. |

(Continued)

*Primary Examiner* — Julia Slutsker
(74) *Attorney, Agent, or Firm* — Myers Bigel, P.A.

(57) ABSTRACT

Semiconductor devices are provided. A semiconductor device includes a first portion of a lower electrode structure on a substrate. The semiconductor device includes a first support pattern being in contact with a first portion of a sidewall of the first portion of the lower electrode structure. The semiconductor device includes a second portion of the lower electrode structure on a second portion of the sidewall of the first portion of the lower electrode structure. The semiconductor device includes an upper electrode on the second portion of the lower electrode structure and on the first support pattern. Moreover, the semiconductor device includes a dielectric layer between the upper electrode and the second portion of the lower electrode structure.

20 Claims, 17 Drawing Sheets

(56) References Cited

U.S. PATENT DOCUMENTS

| | | | |
|---|---|---|---|
| 2013/0015559 A1* | 1/2013 | Lee | H01L 28/60 |
| | | | 257/532 |
| 2014/0065785 A1* | 3/2014 | Yoon | H01L 28/56 |
| | | | 438/381 |
| 2018/0061840 A1* | 3/2018 | Sills | H01L 28/90 |
| 2018/0122709 A1 | 5/2018 | Xie et al. | |
| 2018/0166320 A1* | 6/2018 | Kim | H01L 21/7687 |
| 2020/0126980 A1* | 4/2020 | Park | H01L 21/02343 |

\* cited by examiner

SEMICONDUCTOR DEVICES INCLUDING A SUPPORT PATTERN ON A LOWER ELECTRODE STRUCTURE

CROSS-REFERENCE TO RELATED APPLICATION

This U.S. non-provisional patent application claims priority under 35 U.S.C. § 119 to Korean Patent Application No. 10-2019-0106808, filed on Aug. 29, 2019, in the Korean Intellectual Property Office, the disclosure of which is hereby incorporated by reference in its entirety.

BACKGROUND

The present disclosure relates to semiconductor devices and methods of manufacturing the same and, more particularly, to semiconductor devices with improved electrical characteristics and reliability and methods of manufacturing the same. Light, small, high-speed, multi-functional, high-performance, high-reliability and low-priced electronic components have been increasingly demanded in the electronics industry (e.g., portable phones and notebook/tablet computers). To satisfy these demands, the integration density of semiconductor memory devices may be increased and performance of semiconductor memory devices may be improved.

A capacitance of a capacitor may be increased to improve reliability of a highly integrated semiconductor memory device including the capacitor. The capacitance of the capacitor may increase as a dielectric constant of a dielectric layer of the capacitor increases. Thus, a process technique for forming a capacitor having a high dielectric constant has been variously studied.

SUMMARY

Embodiments of the inventive concepts may provide a semiconductor device with improved electrical characteristics and reliability.

Embodiments of the inventive concepts may also provide a method of manufacturing a semiconductor device with improved electrical characteristics and reliability.

In some embodiments, a semiconductor device may include a first portion of a lower electrode structure on a substrate. The semiconductor device may include a first support pattern being in contact with a first portion of a sidewall of the first portion of the lower electrode structure. The semiconductor device may include a second portion of the lower electrode structure on a second portion of the sidewall of the first portion of the lower electrode structure. The semiconductor device may include an upper electrode on the second portion of the lower electrode structure and on the first support pattern. Moreover, the semiconductor device may include a dielectric layer between the upper electrode and the second portion of the lower electrode structure.

In some embodiments, a semiconductor device may include a lower electrode structure including a first portion on a substrate and a second portion on a surface of the first portion. The semiconductor device may include a support pattern on a sidewall of the first portion of the lower electrode structure. The semiconductor device may include an upper electrode on the lower electrode structure and on the support pattern. Moreover, the semiconductor device may include a dielectric layer between the lower electrode structure and the upper electrode and between the support pattern and the upper electrode. The second portion of the lower electrode structure may include niobium and fluorine, and the second portion of the lower electrode structure may further include at least one of oxygen or nitrogen.

In some embodiments, a semiconductor device may include a lower electrode structure including a first conductive portion on a substrate and a second conductive portion on a surface of the first conductive portion. The semiconductor device may include a support pattern contacting a sidewall of the lower electrode structure. The second conductive portion of the lower electrode structure may be absent from a surface of the support pattern or may be discontinuous on the surface of the support pattern. The semiconductor device may include an upper electrode on the lower electrode structure and on the support pattern. Moreover, the semiconductor device may include a dielectric layer between the lower electrode structure and the upper electrode and between the support pattern and the upper electrode. The second conductive portion of the lower electrode structure may include niobium. The dielectric layer and the second conductive portion of the lower electrode structure may each have a tetragonal structure.

In some embodiments, a method of manufacturing a semiconductor device may include forming electrode holes by etching a mold structure including a mold layer and a support layer which are stacked on a substrate, forming lower electrode pillars filling the electrode holes, etching a portion of the support layer between the lower electrode pillars to form a support pattern having a through-hole exposing a portion of a top surface of the mold layer, removing the mold layer through the through-hole to expose sidewalls of the lower electrode pillars, and selectively forming lower electrode patterns on the sidewalls and top surfaces of the lower electrode pillars.

In some embodiments, a semiconductor device may include an etch stop layer on a substrate, lower electrode pillars penetrating the etch stop layer on the substrate, a first support pattern surrounding sidewalls of lower portions of the lower electrode pillars, the first support pattern having a first through-hole disposed between the lower electrode pillars, a second support pattern surrounding sidewalls of upper portions of the lower electrode pillars, the second support pattern having a second through-hole disposed between the lower electrode pillars and vertically overlapping with the first through-hole, lower electrode patterns disposed on sidewalls of the lower electrode pillars which are exposed by the first and second support patterns, an upper electrode covering the lower electrode pillars, the first and second support patterns, and the lower electrode patterns on the substrate, and a dielectric layer disposed between the upper electrode and the lower electrode patterns. The lower electrode patterns may include at least one of an oxide including niobium and fluorine or a nitride including niobium and fluorine. The lower electrode patterns may have a thickness of 1 Angstrom (Å) to 150 Å.

BRIEF DESCRIPTION OF THE DRAWINGS

The inventive concepts will become more apparent in view of the attached drawings and accompanying detailed description.

DETAILED DESCRIPTION

Figure 1:
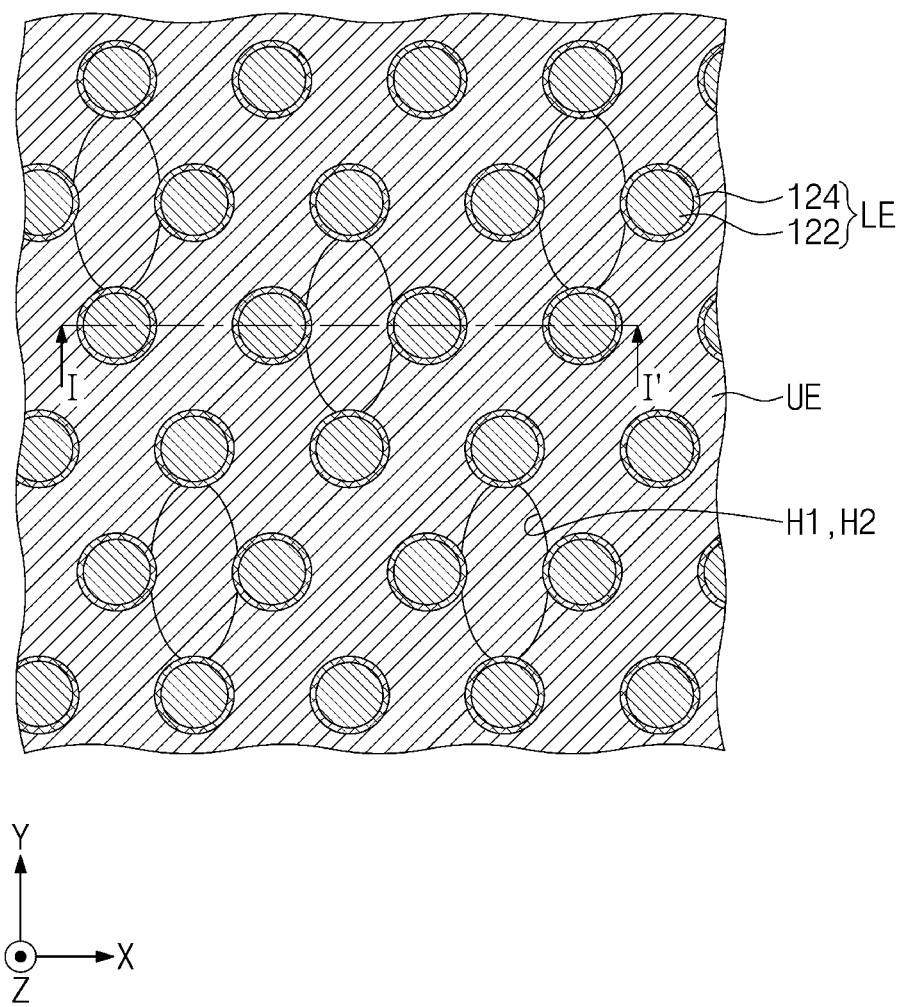
FIG. 1 is a plan view illustrating a semiconductor device according to some embodiments of the inventive concepts.
Figure 2:
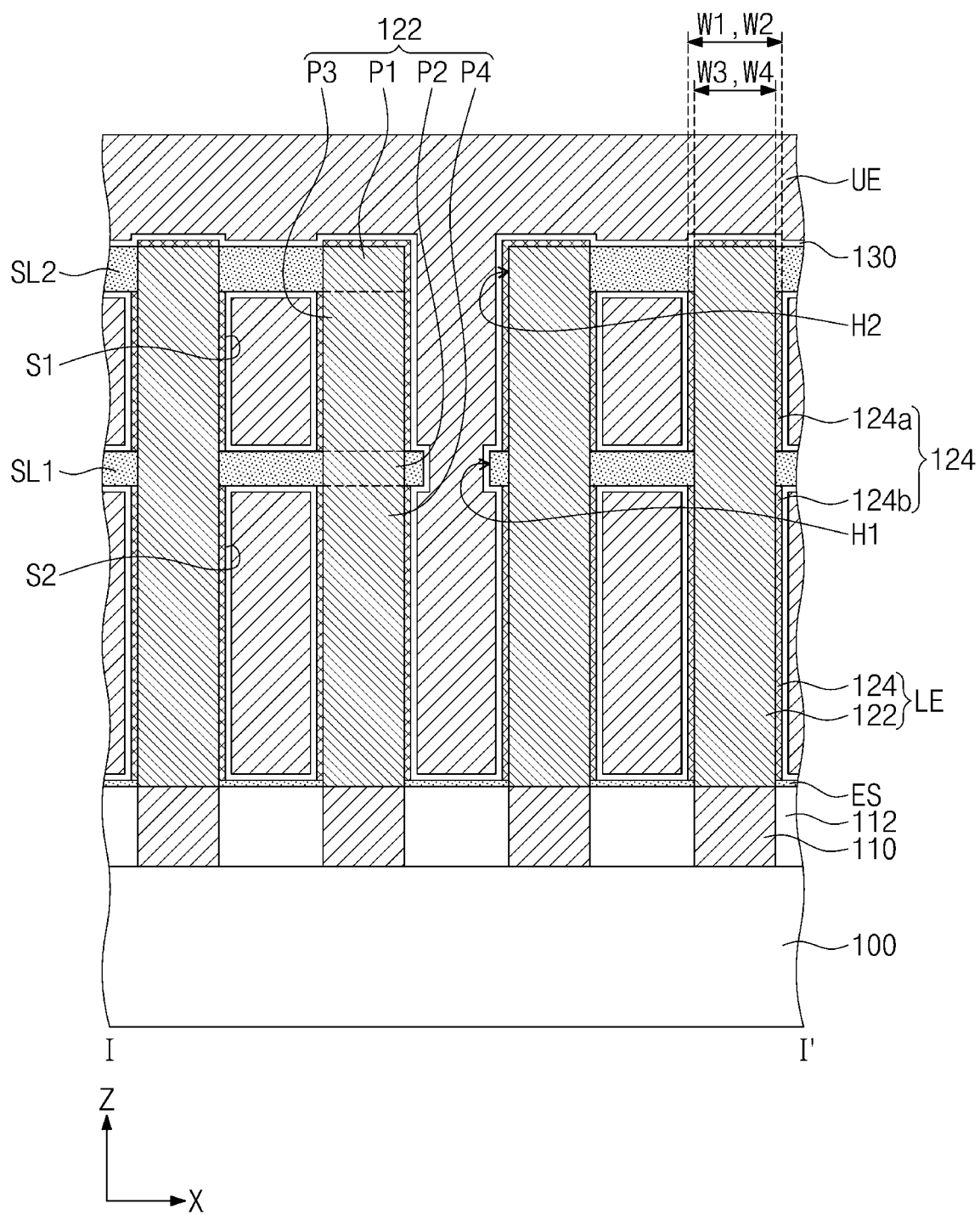
FIG. 2 is a cross-sectional view taken along a line I-I' of FIG. 1 to illustrate a semiconductor device according to some embodiments of the inventive concepts.

FIG. 1 is a plan view illustrating a semiconductor device according to some embodiments of the inventive concepts. FIG. 2 is a cross-sectional view taken along a line I-I' of FIG. 1 to illustrate a semiconductor device according to some embodiments of the inventive concepts.

Referring to FIGS. 1 and 2, a semiconductor device may include contact plugs 110, lower electrode structures LE, a first support pattern SL1, a second support pattern SL2, a dielectric layer 130, and an upper electrode UE.

The contact plugs 110 may be disposed on a substrate 100. The substrate 100 may be a semiconductor substrate such as a silicon substrate, a germanium substrate, or a silicon-germanium (SiGe) substrate. For example, the contact plugs 110 may be arranged in a zigzag form in a first direction X when viewed in a plan view. The contact plugs 110 may include at least one of a doped semiconductor material (e.g., doped poly-crystalline silicon), a metal-semiconductor compound (e.g., tungsten silicide), a conductive metal nitride (e.g., titanium nitride, tantalum nitride, or tungsten nitride), or a metal (e.g., titanium, tungsten, or tantalum).

An interlayer insulating layer 112 may be disposed on the substrate 100. The interlayer insulating layer 112 may fill a space between the contact plugs 110. For example, the interlayer insulating layer 112 may include at least one of a silicon oxide layer, a silicon nitride layer, or a silicon oxynitride layer. In some embodiments, word lines and bit lines intersecting the word lines may be formed on the substrate 100 and/or in the substrate 100. The interlayer insulating layer 112 may be formed to cover the word lines and the bit lines. Dopant regions may be formed in the substrate 100 at both sides of each of the word lines, and each of the contact plugs 110 may be connected to one of the dopant regions.

An etch stop layer ES may be disposed on the interlayer insulating layer 112. The etch stop layer ES may cover a top surface of the interlayer insulating layer 112 and may expose top surfaces of the contact plugs 110. The etch stop layer ES may include, for example, a silicon oxide ($SiO_2$) layer.

Lower electrode pillars 122 may be disposed on the contact plugs 110. For example, each of the lower electrode pillars 122 may have a solid pillar shape extending in a direction (e.g., a third direction Z) perpendicular to a top surface of the substrate 100. The lower electrode pillars 122 may be arranged in a zigzag form in the first direction X on the contact plugs 110. The lower electrode pillars 122 may include at least one of a metal material (e.g., cobalt, titanium, nickel, tungsten, or molybdenum), a metal nitride (e.g., titanium nitride (TiN), titanium-silicon nitride (TiSiN), titanium-aluminum nitride (TiAlN), tantalum nitride (TaN), tantalum-aluminum nitride (TaAlN), or tungsten nitride (WN)), a noble metal (e.g., platinum (Pt), ruthenium (Ru), or iridium (Ir)), a conductive oxide (e.g., PtO, $RuO_2$, $IrO_2$, (strontium (Sr))$RuO_3$ (SRO), (barium (Ba)Sr))$RuO_3$ (BSRO), (calcium (Ca))$RuO_3$ (CRO), or lanthanum strontium cobalt oxide (LSCO)), or a metal silicide.

The first support pattern SL1 may be disposed on sidewalls of the lower electrode pillars 122. The first support pattern SL1 may surround portions of sidewalls of the lower electrode structures LE. The first support pattern SL1 may be in direct contact with the sidewalls of the lower electrode pillars 122. The first support pattern SL1 may have first through-holes H1. For example, each of the first through-holes H1 may be formed to penetrate the first support pattern SL1. Each of the first through-holes H1 may be located in a region between the lower electrode pillars 122 adjacent to each other in the first direction X and between the lower electrode pillars 122 adjacent to each other in a second direction Y intersecting the first direction X when viewed in a plan view. In other words, each of the first through-holes H1 may be disposed between four lower electrode pillars 122 adjacent to each other. The first support pattern SL1 may be disposed on intermediate portions of the sidewalls of the lower electrode pillars 122. For example, the first support pattern SL1 may include silicon oxide.

The second support pattern SL2 may be disposed on the first support pattern SL1 and may be disposed on the sidewalls of the lower electrode structures LE. The first support pattern SL1 may be disposed between the etch stop layer ES and the second support pattern SL2. The second support pattern SL2 may surround portions of the sidewalls of the lower electrode pillars 122. The second support pattern SL2 may be spaced apart from the first support pattern SL1 in the third direction Z. A top surface of the second support pattern SL2 may be coplanar with top surfaces of the lower electrode pillars 122. The second support pattern SL2 may have second through-holes H2. Each of the second through-holes H2 may be located in a region between the lower electrode pillars 122 adjacent to each other in the first direction X and between the lower electrode pillars 122 adjacent to each other in the second direction Y when viewed in a plan view. In other words, each of the second through-holes H2 may be disposed between four lower electrode pillars 122 adjacent to each other. Portions of the sidewalls of the lower electrode pillars 122 may be exposed by the second through-holes H2. The second through-holes H2 may overlap with the first through-holes H1 in the third direction Z. Each of the second through-holes H2 may extend between the adjacent lower electrode pillars 122 so as to be connected to each of the first through-holes H1. Each of the first through-holes H1 may extend to the etch stop layer ES between the adjacent lower electrode pillars 122. For example, the second support pattern SL2 may include silicon oxide. For example, widths of the second through-holes H2 may be greater than widths of the first through-holes H1. Lower electrode patterns 124 may be disposed on the sidewalls and the top surfaces of the lower electrode pillars 122, which are exposed by the first and second support patterns SL1 and SL2. The lower electrode patterns 124 may be in direct contact with the sidewalls and the top surfaces of the lower electrode pillars 122, which are exposed by the first and second support patterns SL1 and SL2. The lower electrode patterns 124 may be locally disposed on the sidewalls and the top surfaces of the lower electrode pillars 122 which are exposed by the first and second support patterns SL1 and SL2 but may not be disposed on surfaces of the first and second support patterns SL1 and SL2 which are exposed by the lower electrode pillars 122. The lower electrode patterns 124 may not be disposed on a top surface of the etch stop layer ES. Thus, top and bottom surfaces of the first and second support patterns SL1 and SL2 and the top surface of the etch stop layer ES may be exposed by the lower electrode patterns 124. Each of the lower electrode patterns 124 may have a thickness of about 1 Angstrom (Å) to about 150 Å. More particularly, each of the lower electrode patterns 124 may have a thickness of about 1 Å to about 10 Å. The lower electrode patterns 124 may be used as a seed layer in crystallization of the dielectric layer 130. For example, the lower electrode patterns 124 may include a metal material having a tetragonal structure. The lower electrode patterns 124 may include a metal material having a high work function. The lower electrode patterns 124 may include niobium and fluorine and may include at least one of oxygen or nitrogen. The lower electrode patterns 124 may include at least one of an oxide including niobium and fluorine, or a nitride including niobium and fluorine. The lower electrode patterns 124 may include a nitride including niobium, an oxide including niobium, or an oxynitride including niobium. For example, the lower electrode patterns 124 may include niobium nitride (NbN) including fluorine, niobium oxide (NbO) including fluorine, or niobium oxynitride (NbON) including fluorine. In some embodiments, each of the lower electrode pillars 122 and the lower electrode patterns 124 disposed on the sidewall of each of the lower electrode pillars 122 may constitute each of the lower electrode structures LE.

Moreover, the lower electrode pillars 122 are not limited to pillar shapes. Rather, each of the lower electrode pillars 122 can be any shape that continuously extends through, and contacts a sidewall of, the first support pattern SL1. Accordingly, a lower electrode pillar 122 and a lower electrode pattern 124 may be broadly referred to herein as a "first portion" and a "second portion," respectively, of a lower electrode structure LE. Moreover, the lower electrode pillar 122 and the lower electrode pattern 124 may each comprise a conductive (e.g., metal or conductive oxide) material.

In some embodiments, each of the lower electrode pillars 122 may include a first portion P1, a second portion P2, a third portion P3, and a fourth portion P4. The first portion P1 may horizontally overlap with the second support pattern SL2. The second portion P2 may horizontally overlap with the first support pattern SL1. The third portion P3 may be disposed between the first portion P1 and the second portion P2 and may not horizontally overlap with either the first support pattern SL1 or the second support pattern SL2. The fourth portion P4 may be disposed between the second portion P2 and each of the contact plugs 110 and may not horizontally overlap with the first support pattern SL1. The lower electrode patterns 124 may include first lower electrode patterns 124a and second lower electrode patterns 124b. The first lower electrode pattern 124a may be on (e.g., cover) a sidewall and a top surface of the first portion P1 and a sidewall of the third portion P3. The second lower electrode pattern 124b may be on (e.g., cover) a sidewall of the fourth portion P4. The first lower electrode pattern 124a and the second lower electrode pattern 124b which are disposed on the same lower electrode pillar 122 may be physically spaced apart from each other by the first support pattern SL1. In other words, the first and second lower electrode patterns 124a and 124b disposed on the same lower electrode pillar 122 may not be connected to each other. The first lower electrode patterns 124a respectively disposed on the lower electrode pillars 122 adjacent to each other in the first direction X and the second direction Y may be physically spaced apart from each other by the second support pattern SL2. The second lower electrode patterns 124b respectively disposed on the lower electrode pillars 122 adjacent to each other in the first direction X and the second direction Y may be physically spaced apart from each other by the first support pattern SL1.

In some embodiments, the first and second lower electrode patterns 124a and 124b disposed on the same lower electrode pillar 122 may be connected to each other. The first lower electrode patterns 124a respectively disposed on the lower electrode pillars 122 adjacent to each other in the first direction X and the second direction Y may be physically spaced apart from each other by the second support pattern SL2. The second lower electrode patterns 124b respectively disposed on the lower electrode pillars 122 adjacent to each other in the first direction X and the second direction Y may be physically spaced apart from each other by the second support pattern SL2.

In some embodiments, a first width W1 corresponding to a sum of a width of the third portion P3 of each of the lower electrode pillars 122 and twice a thickness of the lower electrode pattern 124 on (e.g., covering) the sidewall of the third portion P3 may be substantially equal to a second width W2 corresponding to a sum of a width of the fourth portion P4 of each of the lower electrode pillars 122 and twice a thickness of the lower electrode pattern 124 on (e.g., covering) the sidewall of the fourth portion P4. A third width W3 of the first portion P1 of each of the lower electrode pillars 122 may be substantially equal to a fourth width W4 of the second portion P2 of each of the lower electrode pillars 122. The first width W1 and the second width W2 may be greater than the third width W3 and the fourth width W4. For example, each of the first and second widths W1 and W2 may be greater than each of the third and fourth widths W3 and W4 by twice the thickness of the lower electrode pattern 124.

The upper electrode UE may be disposed on the lower electrode structures LE, the etch stop layer ES, and the first and second support patterns SL1 and SL2. The upper electrode UE may fill first spaces S1 of which each is defined by the first and second support patterns SL1 and SL2 between adjacent lower electrode structures LE, second spaces S2 of which each is defined by the first support pattern SL1 and the etch stop layer ES between the adjacent lower electrode structures LE, the first through-holes H1, and the second through-holes H2. The upper electrode UE may be formed of at least one of a semiconductor material doped with dopants, a metal material, a metal nitride, or a metal silicide. In some embodiments, the upper electrode UE may be formed of a refractory metal material such as cobalt, titanium, nickel, tungsten, and/or molybdenum. In some embodiments, the upper electrode UE may be formed of a metal nitride such as titanium nitride (TiN), titanium-aluminum nitride (TiAlN), and/or tungsten nitride (WN). In some embodiments, the upper electrode UE may be formed of at least one of platinum (Pt), ruthenium (Ru), or iridium (Ir).

The dielectric layer 130 may be disposed between the upper electrode UE and the lower electrode structures LE, between the upper electrode UE and the first support pattern SL1, between the upper electrode UE and the second support pattern SL2, and between the upper electrode UE and the etch stop layer ES. The dielectric layer 130 may be disposed on the lower electrode patterns 124 disposed on the sidewalls and the top surfaces of the lower electrode pillars 122, the top and bottom surfaces of the first and second support patterns SL1 and SL2, sidewalls of the first through-holes H1 of the first support pattern SL1, and the top surface of the etch stop layer ES. The dielectric layer 130 may be physically spaced apart from the lower electrode pillars 122 and may be in direct contact with the lower electrode patterns 124. The dielectric layer 130 may be in direct contact with the top and bottom surfaces of the first and second support patterns SL1 and SL2 and the sidewalls of the first through-holes H1. In some embodiments, portions of the dielectric layer 130 which are disposed between the upper electrode UE and the top and bottom surfaces of the first and second support patterns SL1 and SL2 and between the upper electrode UE and the sidewalls of the first through-holes H1 may have substantially flat surfaces. In other words, the first and second support patterns SL1 and SL2 may not include any layer and/or any pattern between the dielectric layer 130 and the top and bottom surfaces thereof and between the dielectric layer 130 and the sidewalls of the first through-holes H1. The dielectric layer 130 may have a tetragonal structure. For example, the dielectric layer 130 may be formed of at least one of a metal oxide (e.g., hafnium oxide (HfO$_2$), zirconium oxide (ZrO$_2$), Al$_2$O$_3$, lanthanum oxide (La$_2$O$_3$), Ta$_2$O$_3$, or TiO$_2$) or a perovskite dielectric material (e.g., SrTiO$_3$ (STO), (Ba, Sr)TiO$_3$ (BST), BaTiO$_3$, PZT, or PLZT). The dielectric layer 130 may have a single-layer structure or a multi-layer structure.

Figure 3:
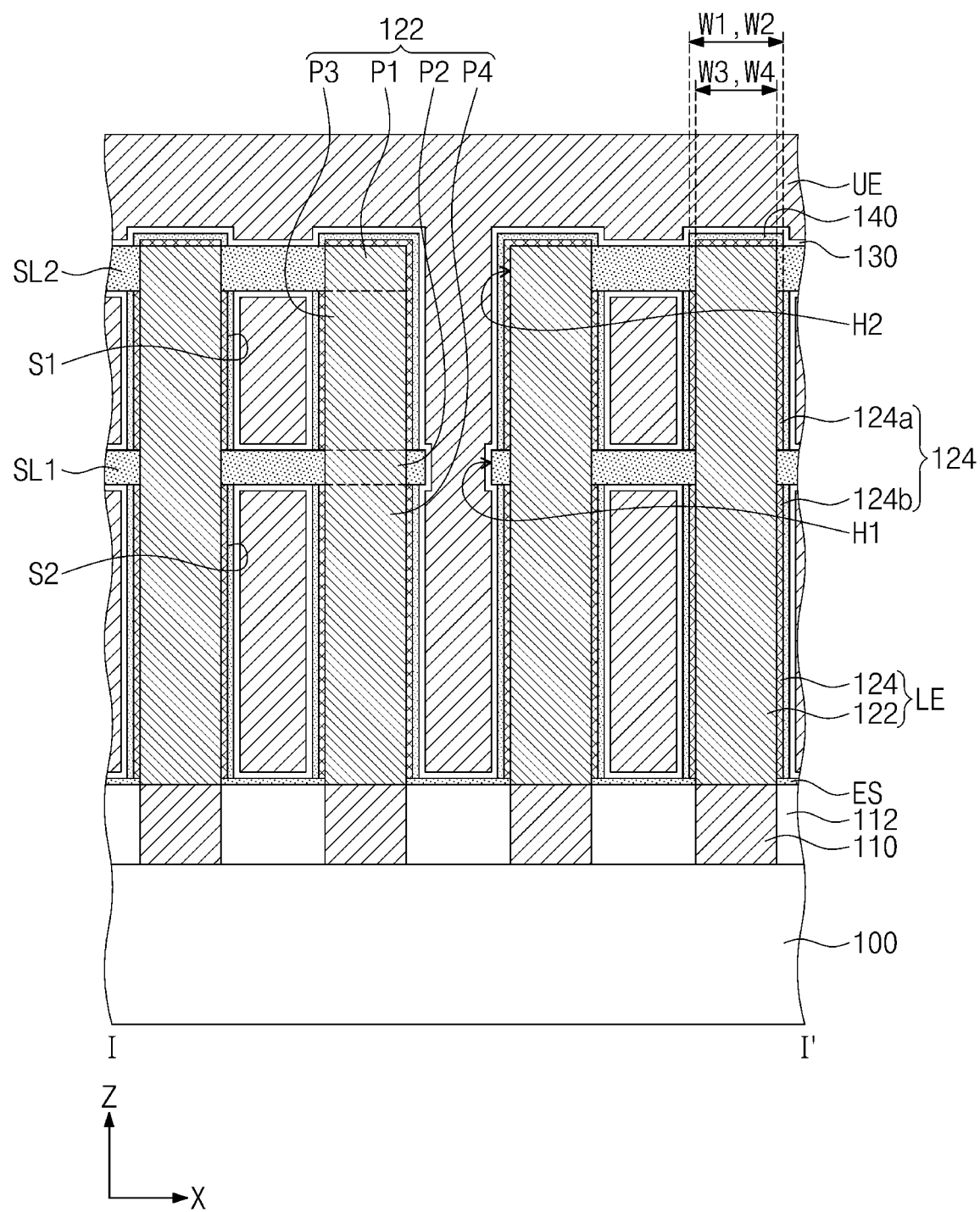
FIG. 3 is a cross-sectional view taken along the line I-I' of FIG. 1 to illustrate a semiconductor device according to some embodiments of the inventive concepts.

FIG. 3 is a cross-sectional view taken along the line I-I' of FIG. 1 to illustrate a semiconductor device according to some embodiments of the inventive concepts.

Referring to FIG. 3, metal oxide patterns 140 may be locally disposed between the dielectric layer 130 and the lower electrode patterns 124. In other words, the metal oxide patterns 140 may not be disposed between the dielectric layer 130 and the top and bottom surfaces of the first and second support patterns SL1 and SL2, between the dielectric layer 130 and the sidewalls of the first through-holes H1, and between the dielectric layer 130 and the etch stop layer ES. The metal oxide patterns 140 may be in direct contact with the dielectric layer 130. The dielectric layer 130 may be physically spaced apart from the lower electrode pillars 122 and the lower electrode patterns 124 by the metal oxide patterns 140. The metal oxide patterns 140 may include, for example, niobium oxide (NbO). The metal oxide patterns 140 may include fluorine.

Figure 4:
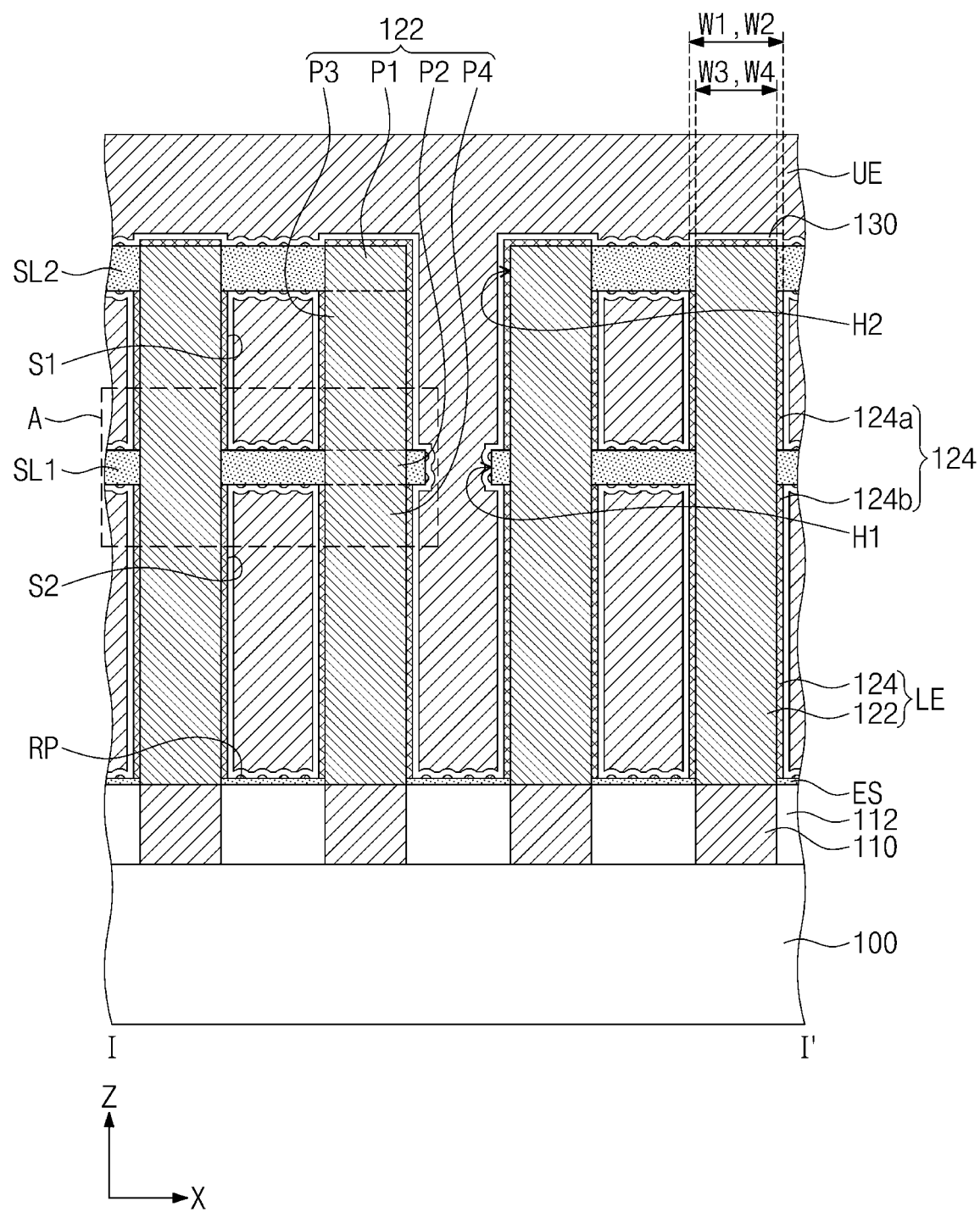
FIG. 4 is a cross-sectional view taken along the line I-I' of FIG. 1 to illustrate a semiconductor device according to some embodiments of the inventive concepts.
Figure 5:
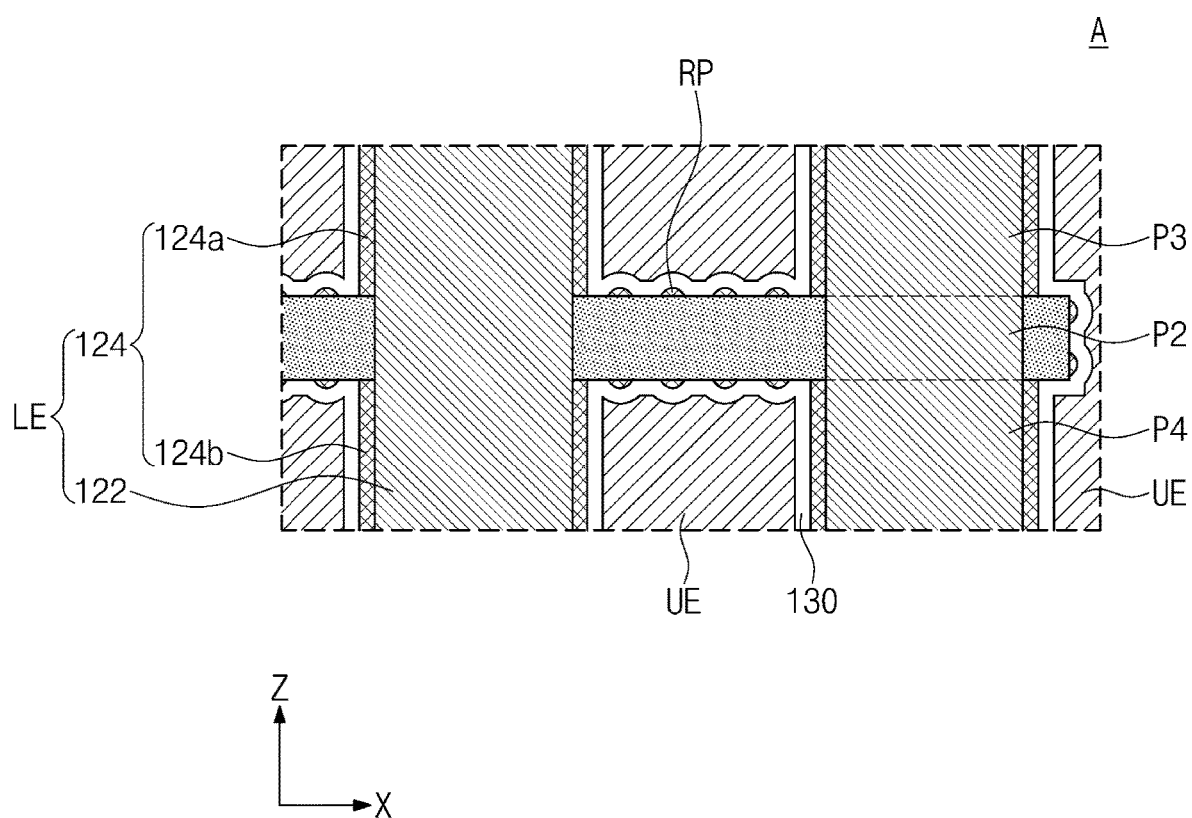
FIG. 5 is an enlarged cross-sectional view of a portion 'A' of FIG. 4.

FIG. 4 is a cross-sectional view taken along the line I-I' of FIG. 1 to illustrate a semiconductor device according to some embodiments of the inventive concepts. FIG. 5 is an enlarged cross-sectional view of a portion 'A' of FIG. 4.

Referring to FIGS. 4 and 5, metal residual patterns RP may be disposed on sidewalls and top and bottom surfaces of the first and second support patterns SL1 and SL2 and the top surface of the etch stop layer ES. The metal residual patterns RP may be disposed between the dielectric layer 130 and the top and bottom surfaces of the first support pattern SL1, between the dielectric layer 130 and the top and bottom surfaces of the second support pattern SL2, between the dielectric layer 130 and the sidewalls of the first through-holes H1 of the first support pattern SL1, and/or between the dielectric layer 130 and the top surface of the etch stop layer ES. The metal residual patterns RP may be in direct contact with the top and bottom surfaces of the first and second support patterns SL1 and SL2, the sidewalls of the first through-holes H1, and the top surface of the etch stop layer ES. The metal residual patterns RP may be spaced apart from each other. The metal residual patterns RP may be physically spaced apart from the lower electrode patterns 124. The metal residual patterns RP may not physically/electrically connect the lower electrode structures LE adjacent to each other. The metal residual patterns RP may have hemispherical shapes when viewed in a cross-sectional view. The metal residual patterns RP may include the same material as the lower electrode patterns 124. For example, the metal residual patterns RP may include a nitride including niobium, an oxide including niobium, or an oxynitride including niobium. For example, the metal residual patterns RP may include niobium nitride (NbN) including fluorine, niobium oxide (NbO) including fluorine, or niobium oxynitride (NbON) including fluorine.

Figure 6:
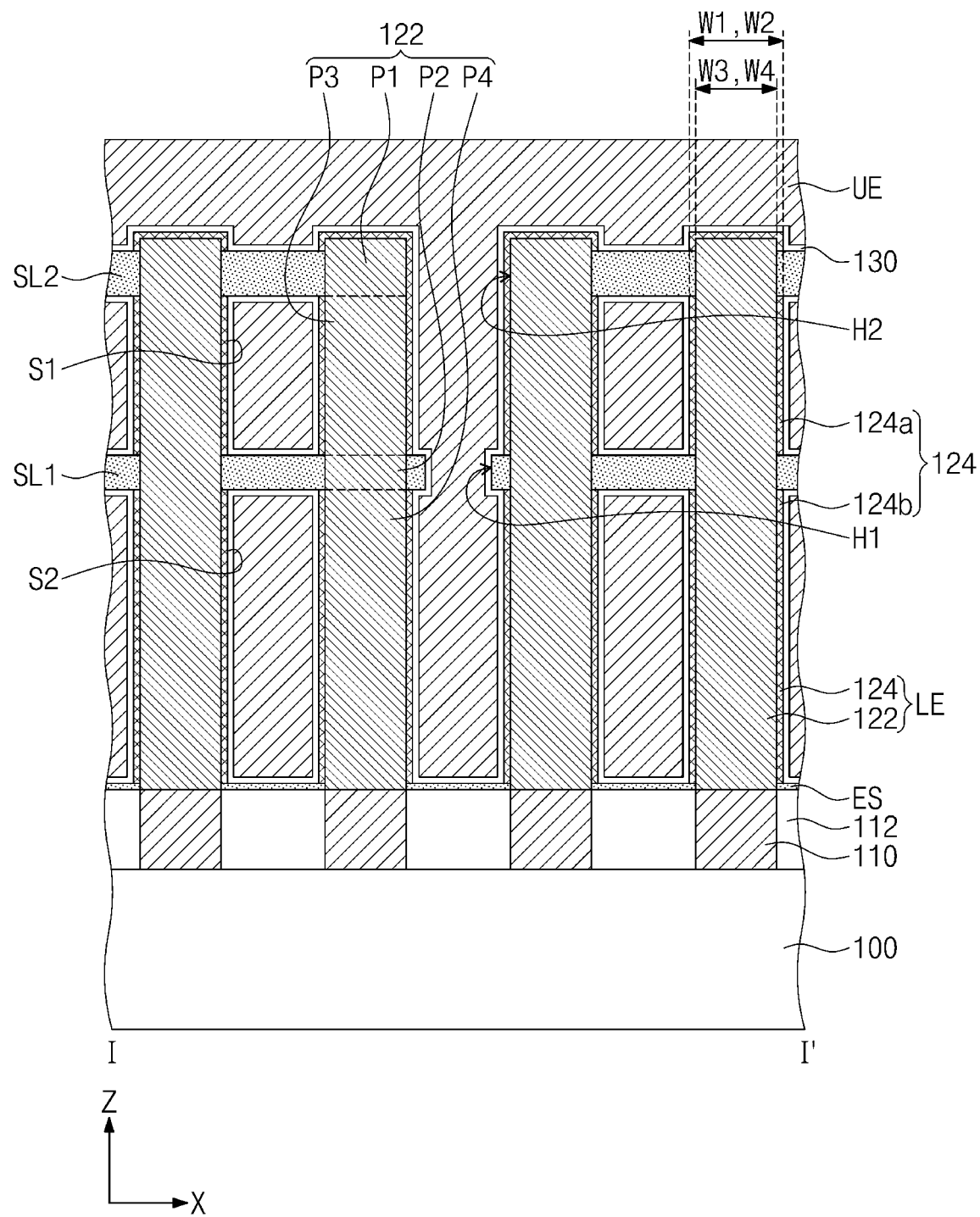
FIG. 6 is a cross-sectional view taken along the line I-I' of FIG. 1 to illustrate a semiconductor device according to some embodiments of the inventive concepts.

FIG. 6 is a cross-sectional view taken along the line I-I' of FIG. 1 to illustrate a semiconductor device according to some embodiments of the inventive concepts.

Referring to FIG. 6, a top surface of the second support pattern SL2 may not be coplanar with top surfaces of the lower electrode pillars 122. A level of the top surface of the second support pattern SL2 from the top surface of the substrate 100 may be lower than a level of the top surfaces of the lower electrode pillars 122 from the top surface of the substrate 100. Upper portions of the first portions P1 of the lower electrode pillars 122 may protrude upward beyond (i.e., above a level of) the top surface of the second support pattern SL2. Sidewalls of the upper portions of the first portions P1 of the lower electrode pillars 122, which are vertically aligned with sidewalls of the first portions P1 being in contact with the second support pattern SL2, may be exposed by the second support pattern SL2. Accordingly, each lower electrode pillar 122 may have a constant width. The lower electrode patterns 124 on (e.g., covering) the top surfaces of the lower electrode pillars 122 may extend onto the sidewalls of the upper portions of the first portions P1 of the lower electrode pillars 122, which are exposed by the second support pattern SL2. The top and bottom surfaces of the second support pattern SL2 may be exposed by the lower electrode patterns 124.

Figure 7:
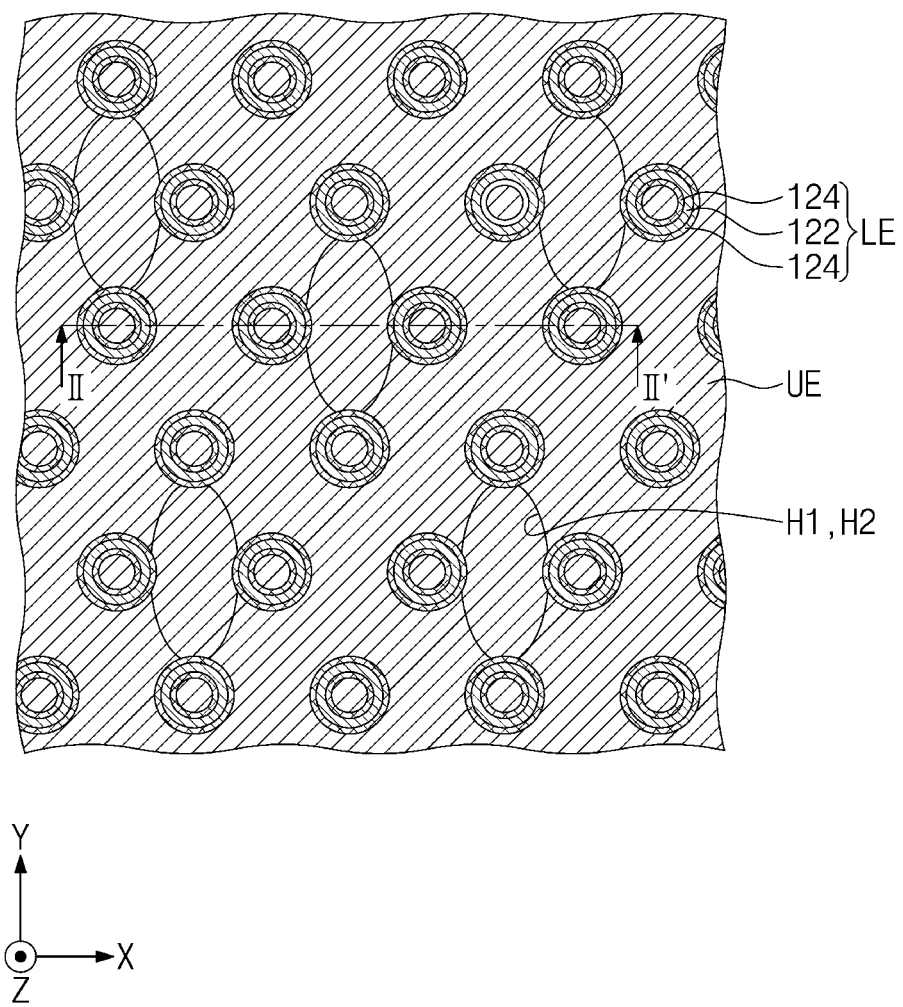
FIG. 7 is a plan view illustrating a semiconductor device according to some embodiments of the inventive concepts.
Figure 8:
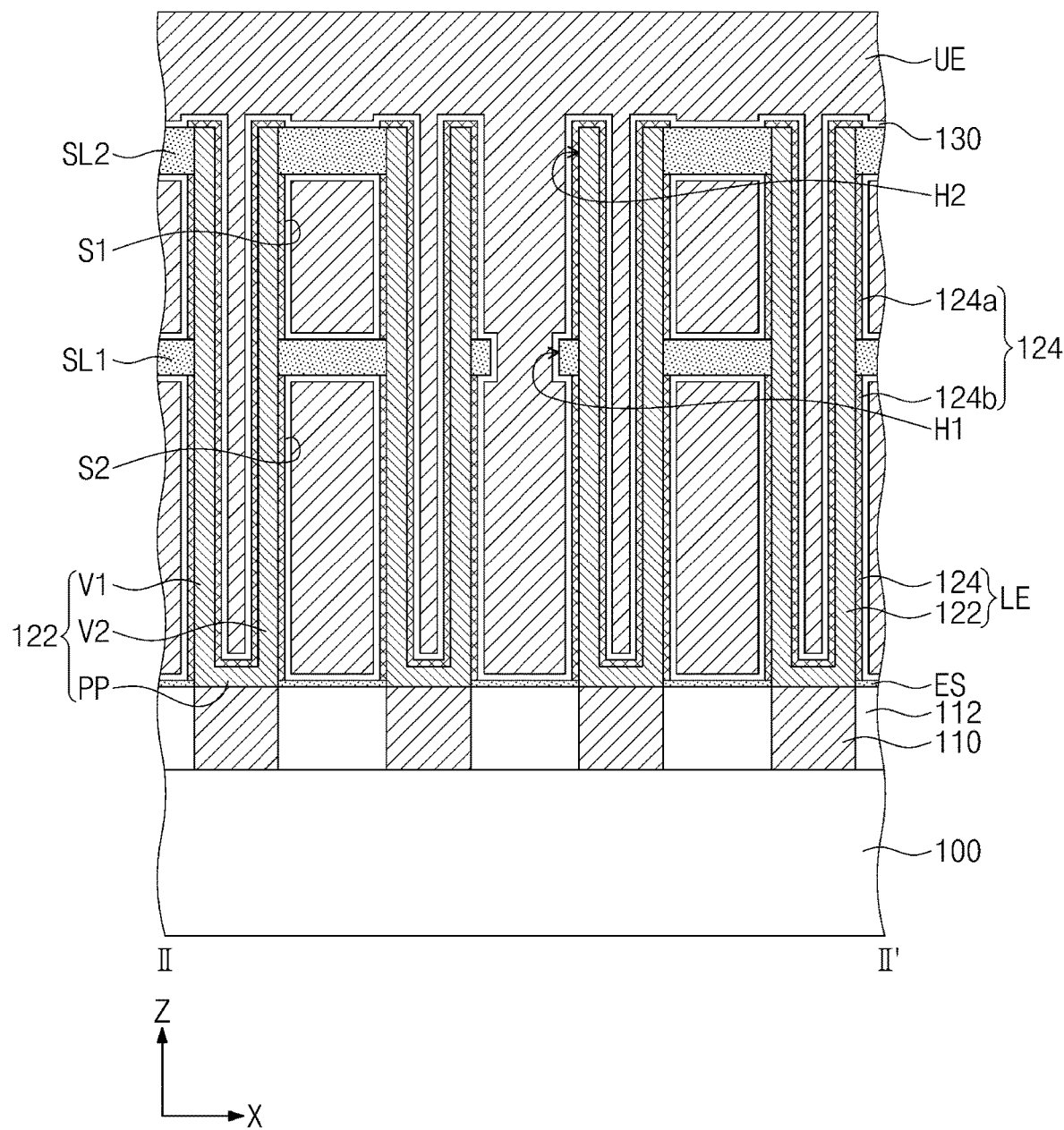
FIG. 8 is a cross-sectional view taken along a line II-IF of FIG. 7 to illustrate a semiconductor device according to some embodiments of the inventive concepts.

FIG. 7 is a plan view illustrating a semiconductor device according to some embodiments of the inventive concepts. FIG. 8 is a cross-sectional view taken along a line II-II' of FIG. 7 to illustrate a semiconductor device according to some embodiments of the inventive concepts.

Referring to FIGS. 7 and 8, each of lower electrode pillars 122 may include a horizontal portion PP, a first vertical portion V1, and a second vertical portion V2. The horizontal portion PP may be parallel to the top surface of the substrate 100. The horizontal portion PP may be in contact with the top surface of each of the contact plugs 110. The first vertical portion V1 may extend in the third direction Z from a first end portion of the horizontal portion PP. The first vertical portion V1 may be connected to the first end portion of the horizontal portion PP. The second vertical portion V2 may extend in the third direction Z from a second end portion, opposite to the first end portion, of the horizontal portion PP. The second vertical portion V2 may be connected to the second end portion. The first vertical portion V1 and the second vertical portion V2 may be spaced apart from each other in the first direction X and may be parallel to each other along the third direction Z. The lower electrode pillars 122 may have cylindrical shapes. The first and second support patterns SL1 and SL2 may be disposed on portions of outer sidewalls of the lower electrode pillars 122. The first and second support patterns SL1 and SL2 may not be disposed on inner sidewalls of the lower electrode pillars 122. In other words, the first and second support patterns SL1 and SL2 may not be disposed in inner spaces surrounded by the lower electrode pillars 122. Thus, entire inner surfaces (e.g., the inner sidewalls and bottom surfaces) of the lower electrode pillars 122 may be exposed by the first and second support patterns SL1 and SL2.

In some embodiments, the first lower electrode patterns 124a may extend onto the inner sidewalls and the bottom surfaces of the lower electrode pillars 122. The first lower electrode patterns 124a may be in direct contact with the inner sidewalls and the bottom surfaces of the lower electrode pillars 122.

Figure 9:
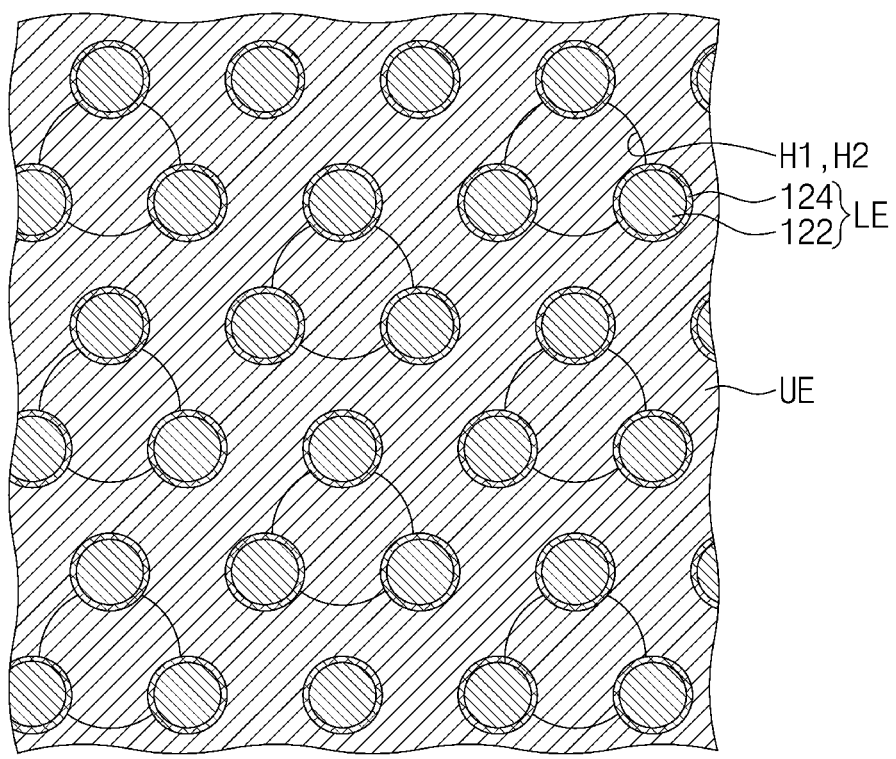
FIG. 9 is a plan view illustrating a semiconductor device according to some embodiments of the inventive concepts.

FIG. 9 is a plan view illustrating a semiconductor device according to some embodiments of the inventive concepts.

Referring to FIG. 9, a first through-hole H1 of the first support pattern SL1 and a second through-hole H2 of the second support pattern SL2 which overlap with each other in the third direction Z may be disposed between three lower electrode structures LE adjacent to each other. The first and second through-holes H1 and H2 may pass between the three lower electrode structures LE adjacent to each other.

FIGS. 10A to 10H are cross-sectional views taken along the line I-I' of FIG. 1 to illustrate a method of manufacturing a semiconductor device according to some embodiments of the inventive concepts.

Figure 10A:
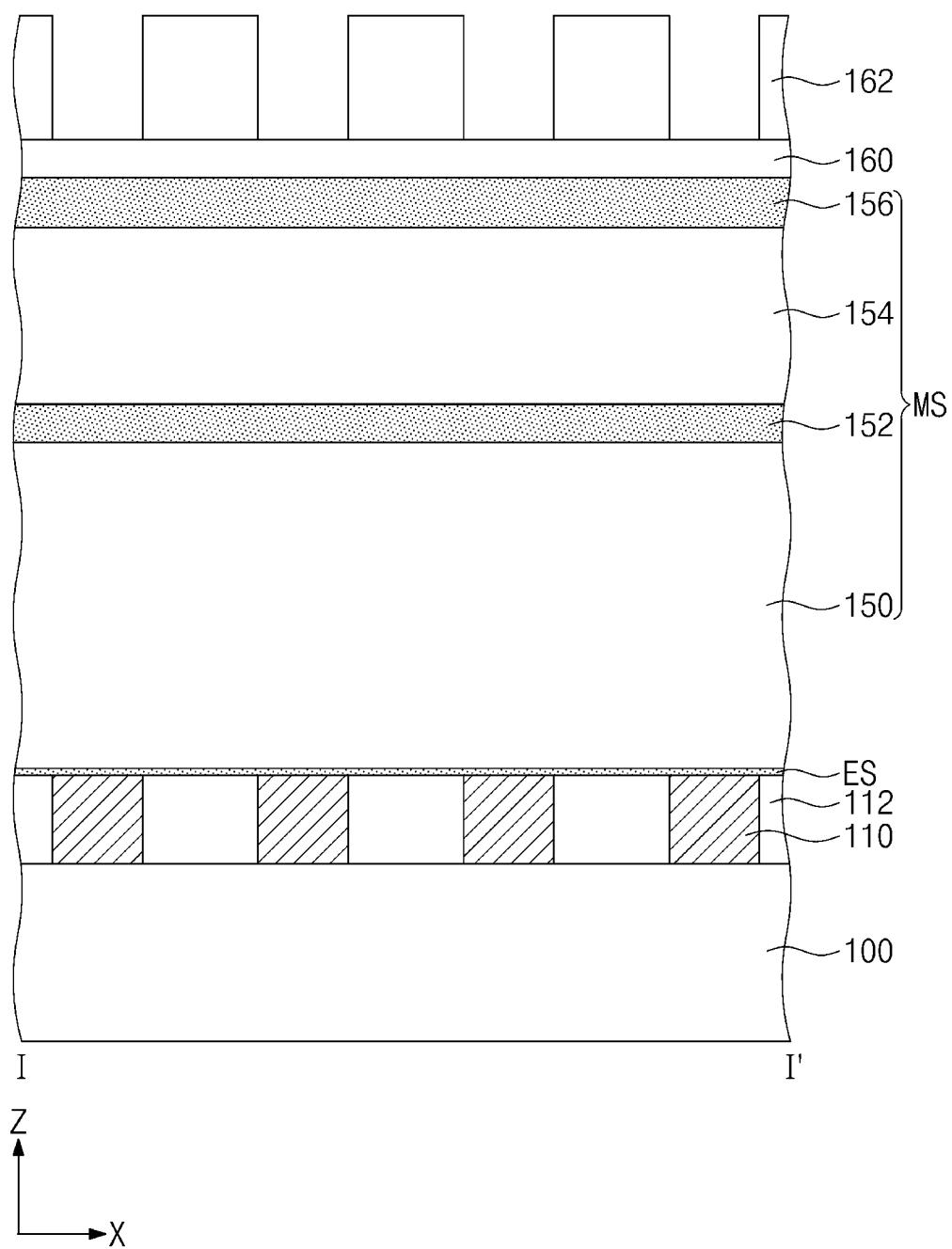
FIGS. 10A to 10H are cross-sectional views taken along the line I-I' of FIG. 1 to illustrate a method of manufacturing a semiconductor device according to some embodiments of the inventive concepts.

Referring to FIG. 10A, an interlayer insulating layer 112 may be formed on a substrate 100. The substrate 100 may be a semiconductor substrate such as a silicon substrate, a germanium substrate, or a silicon-germanium (SiGe) substrate. For example, the interlayer insulating layer 112 may include at least one of a silicon oxide layer, a silicon nitride layer, or a silicon oxynitride layer.

Contact plugs 110 may be formed in the interlayer insulating layer 112. Top surfaces of the contact plugs 110 may be exposed by the interlayer insulating layer 112. The contact plugs 110 may include at least one of a doped semiconductor material (e.g., doped poly-crystalline silicon), a metal-semiconductor compound (e.g., tungsten silicide), a conductive metal nitride (e.g., titanium nitride, tantalum nitride, or tungsten nitride), or a metal (e.g., titanium, tungsten, or tantalum). In some embodiments, word lines and bit lines intersecting the word lines may be formed on the substrate 100 and/or in the substrate 100. The interlayer insulating layer 112 may be formed to cover the word lines and the bit lines. In some embodiments, dopant regions may be formed in the substrate 100 at both (i.e., opposite) sides of each of the word lines, and each of the contact plugs 110 may be connected to one of the dopant regions.

An etch stop layer ES may be formed on the contact plugs 110 and the interlayer insulating layer 112. The etch stop layer ES may cover the top surfaces of the contact plugs 110 and a top surface of the interlayer insulating layer 112. The etch stop layer ES may include, for example, a silicon oxide layer.

A mold structure MS may be formed on the etch stop layer ES. The mold structure MS may include a first mold layer 150, a first support layer 152, a second mold layer 154 and a second support layer 156, which are sequentially formed on the etch stop layer ES. The first mold layer 150 may include, for example, a silicon nitride layer. The first support layer 152 may include a material having an etch selectivity with respect to the first mold layer 150. The first support layer 152 may include, for example, a silicon oxide layer. The second mold layer 154 may include a material having an etch selectivity with respect to the first support layer 152. The second mold layer 154 may include the same material as the first mold layer 150. For example, the second mold layer 154 may include a silicon nitride layer. The second support layer 156 may include a material having an etch selectivity with respect to the second mold layer 154. The second support layer 156 may include the same material as the first support layer 152. The second support layer 156 may include, for example, a silicon oxide layer.

A first mask layer 160 and a second mask layer 162 may be sequentially formed on the mold structure MS. The first mask layer 160 may cover the second support layer 156. For example, the first mask layer 160 may include at least one of a poly-silicon layer, a silicon nitride layer, or a silicon oxynitride layer. The second mask layer 162 may be formed on the first mask layer 160. The second mask layer 162 may have openings. Portions of a top surface of the first mask layer 160 may be exposed through the openings. For example, the second mask layer 162 may be formed of a spin-on-hardmask (SOH) layer or an amorphous carbon layer (ACL).

Figure 10B:
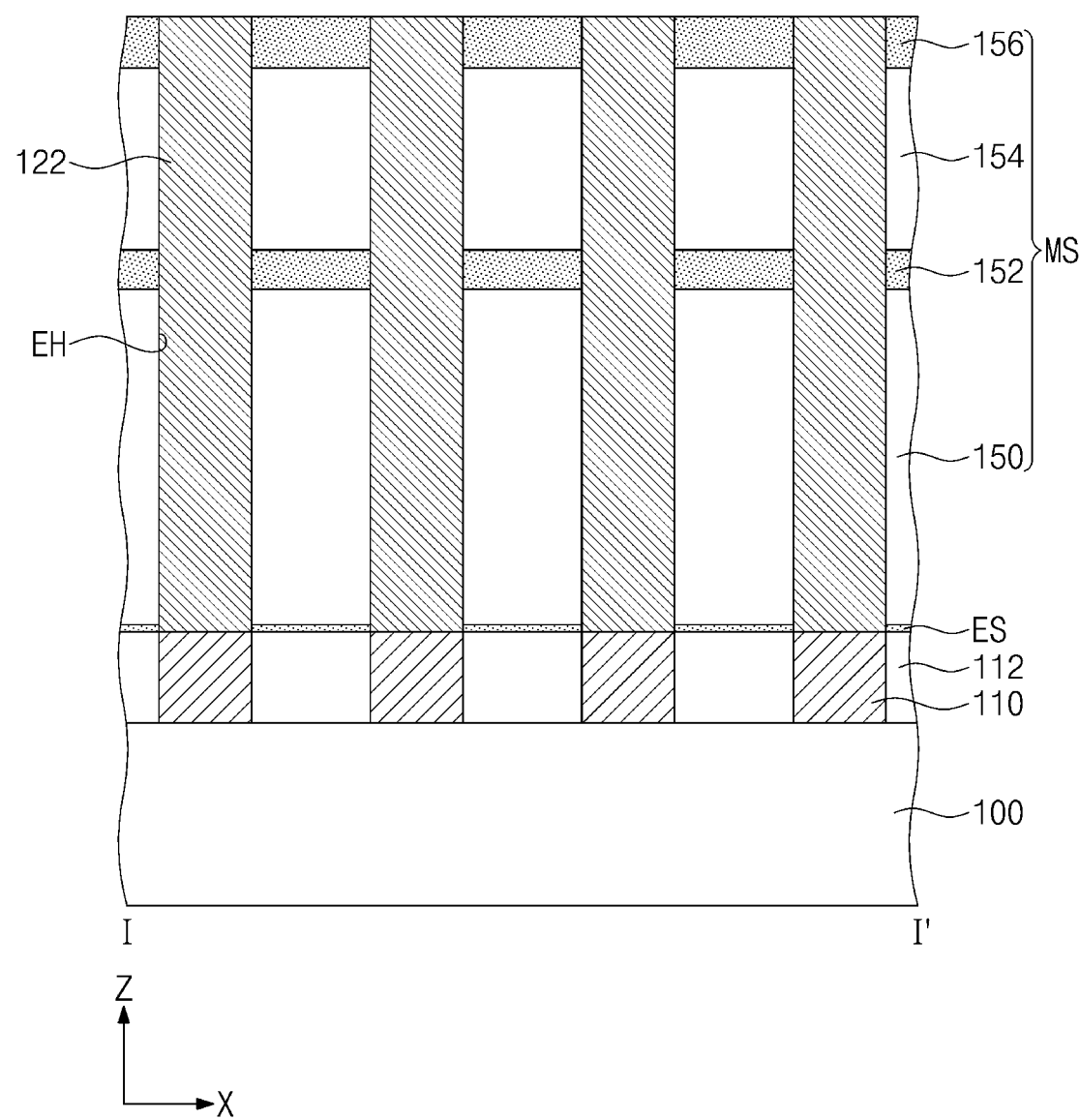

Referring to FIG. 10B, the first mask layer 160, the mold structure MS and the etch stop layer ES may be anisotropically etched using the second mask layer 162 as an etch mask. Thus, electrode holes EH may be formed in the mold structure MS and the etch stop layer ES. For example, the electrode holes EH may be formed by anisotropically etching the first mask layer 160, the second support layer 156, the second mold layer 154, the first support layer 152, the first mold layer 150, and the etch stop layer ES sequentially in the order named. The top surfaces of the contact plugs 110 may be exposed by the electrode holes EH. Portions of the first and second mold layers 150 and 154, the first and second support layers 152 and 156 and the etch stop layer ES may be exposed by sidewalls of the electrode holes EH. For example, the anisotropic etching process may be a dry etching process. The dry etching process may use an etching gas. The etching gas may include an etching gas for etching the first and second mold layers 150 and 154 and an etching gas for etching the first and second support layers 152 and 156. In some embodiments, the first mask layer 160 and the second mask layer 162 may be removed in the anisotropic etching process. In some embodiments, the first mask layer 160 and the second mask layer 162 may be removed by an additional etching process after the anisotropic etching process.

Lower electrode pillars 122 may be formed to fill the electrode holes EH, respectively. The formation of the lower electrode pillars 122 may include forming a lower electrode layer filling the electrode holes EH and covering the mold structure MS, and performing a planarization process on the lower electrode layer until a top surface of the second support layer 156 is exposed. Since the electrode holes EH have a high aspect ratio, a deposition process for forming the lower electrode pillars 122 may use a layer-formation technique having an excellent property of step coverage. For example, the lower electrode pillars 122 may be formed using a chemical vapor deposition (CVD) process or an atomic layer deposition (ALD) process. The planarization process may be performed using a chemical mechanical polishing (CMP) process. When the lower electrode layer completely fills the electrode holes EH, the lower electrode pillars 122 may have solid pillar shapes, as illustrated in FIG. 9 and FIG. 10B. When the lower electrode layer is formed to conformally cover the sidewalls and bottom surfaces of the electrode holes EH, the lower electrode pillars 122 may have cylindrical shapes, as illustrated in FIG. 8. The lower electrode pillars 122 may be in direct contact with the sidewalls of the electrode holes EH. The lower electrode pillars 122 may include at least one of a metal material (e.g., cobalt, titanium, nickel, tungsten, or molybdenum), a metal nitride (e.g., titanium nitride (TiN), titanium-silicon nitride (TiSiN), titanium-aluminum nitride (TiAlN), tantalum nitride (TaN), tantalum-aluminum nitride (TaAlN), or tungsten nitride (WN)), a noble metal (e.g., platinum (Pt), ruthenium (Ru), or iridium (Ir)), a conductive oxide (e.g., PtO, $RuO_2$, $IrO_2$, $SrRuO_3$ (SRO), (Ba, Sr)$RuO_3$ (BSRO), $CaRuO_3$ (CRO), or LSCO), or a metal silicide.

Figure 10C:
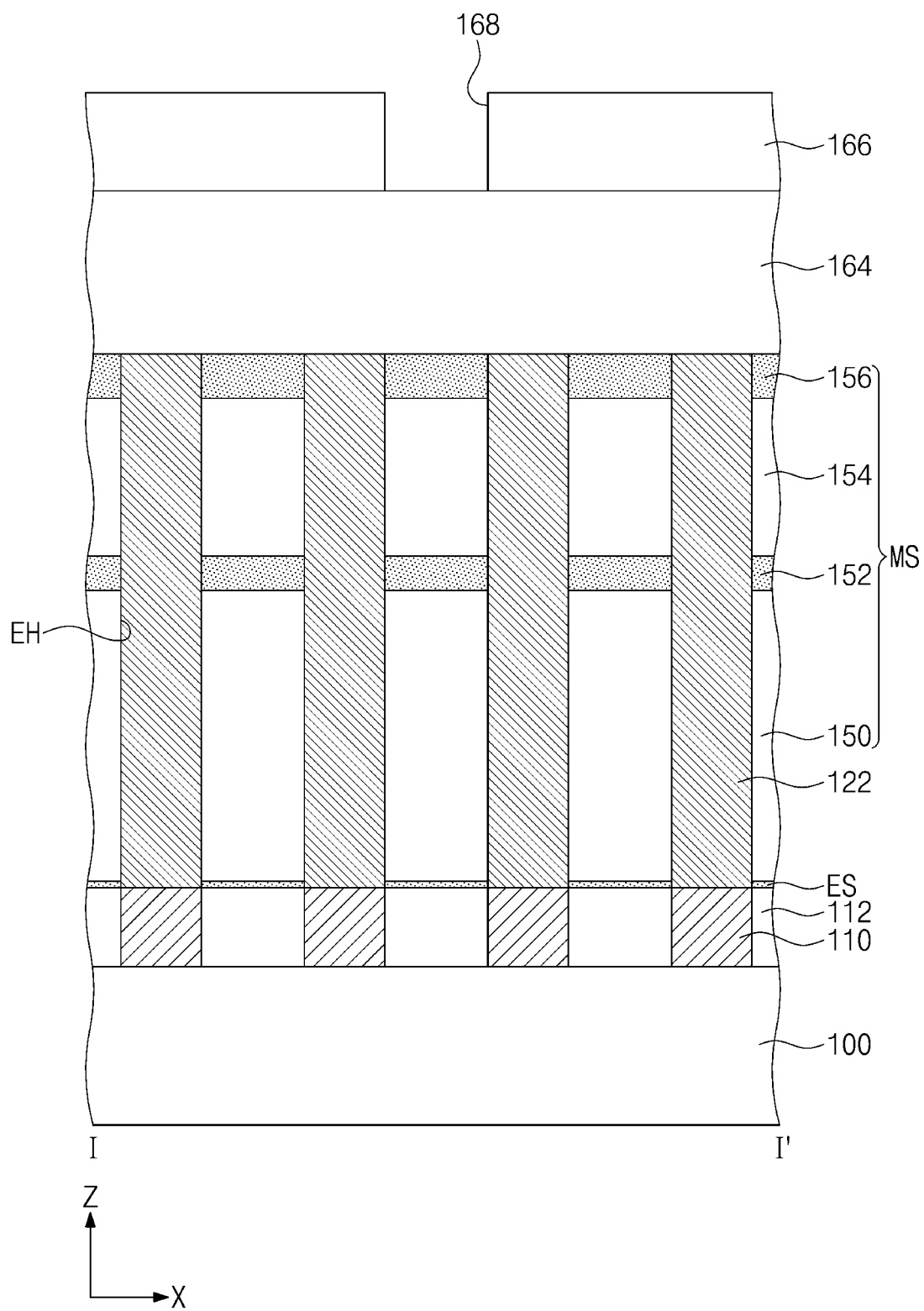

Referring to FIG. 10C, a third mask layer 164 may be formed on the mold structure MS in which the lower electrode pillars 122 are formed. The third mask layer 164 may be formed of a material having an etch selectivity with respect to the second support layer 156. The third mask layer 164 may include, for example, a poly-silicon layer. A photoresist layer 166 may be formed on the third mask layer 164. The photoresist layer 166 may have openings 168. Each of the openings 168 may be located on a portion of the second support layer 156, which is disposed between a pair of the lower electrode pillars 122 adjacent to each other in the first direction X and between a pair of the lower electrode pillars 122 adjacent to each other in the second direction Y (see FIG. 1). A width of each of the openings 168 may be equal to or greater than a distance between the lower electrode pillars 122 adjacent to each other.

Figure 10D:
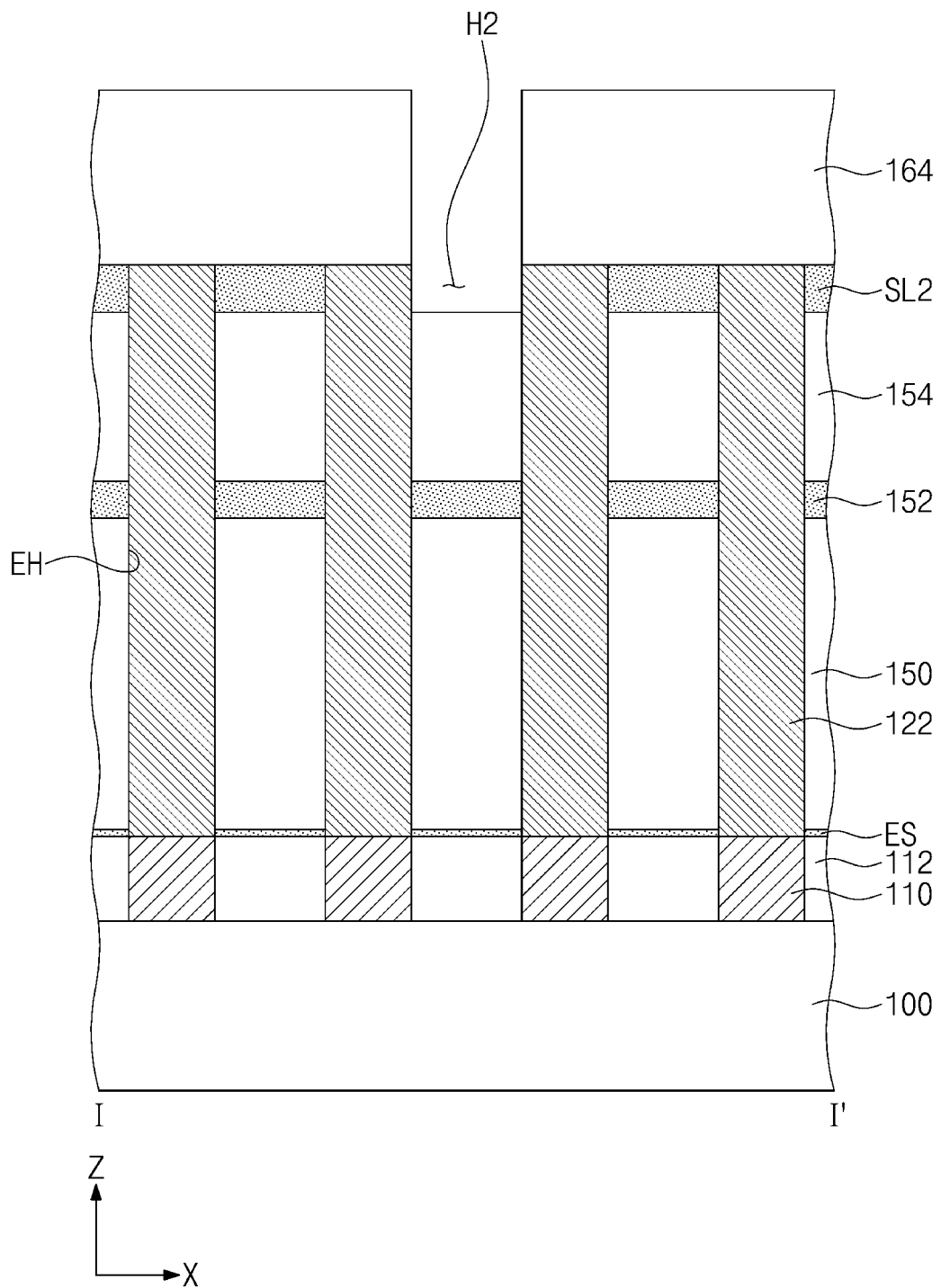

Referring to FIG. 10D, the third mask layer 164 and the second support layer 156 may be sequentially anisotropically etched using the photoresist layer 166 as an etch mask. Thus, portions of the third mask layer 164 and portions of the second support layer 156 which are exposed by the openings 168 may be etched, and a second support pattern SL2 having second through-holes H2 may be formed. Portions of a top surface of the second mold layer 154 and portions of sidewalls of the lower electrode pillars 122 may be exposed by the second through-holes H2. The photoresist layer 166 may be removed in the anisotropic etching process. Thus, a top surface of the third mask layer 164 may be exposed. For example, the anisotropic etching process may be a dry etching process. The dry etching process may be performed using an etching gas for etching the second support layer 156.

Figure 10E:
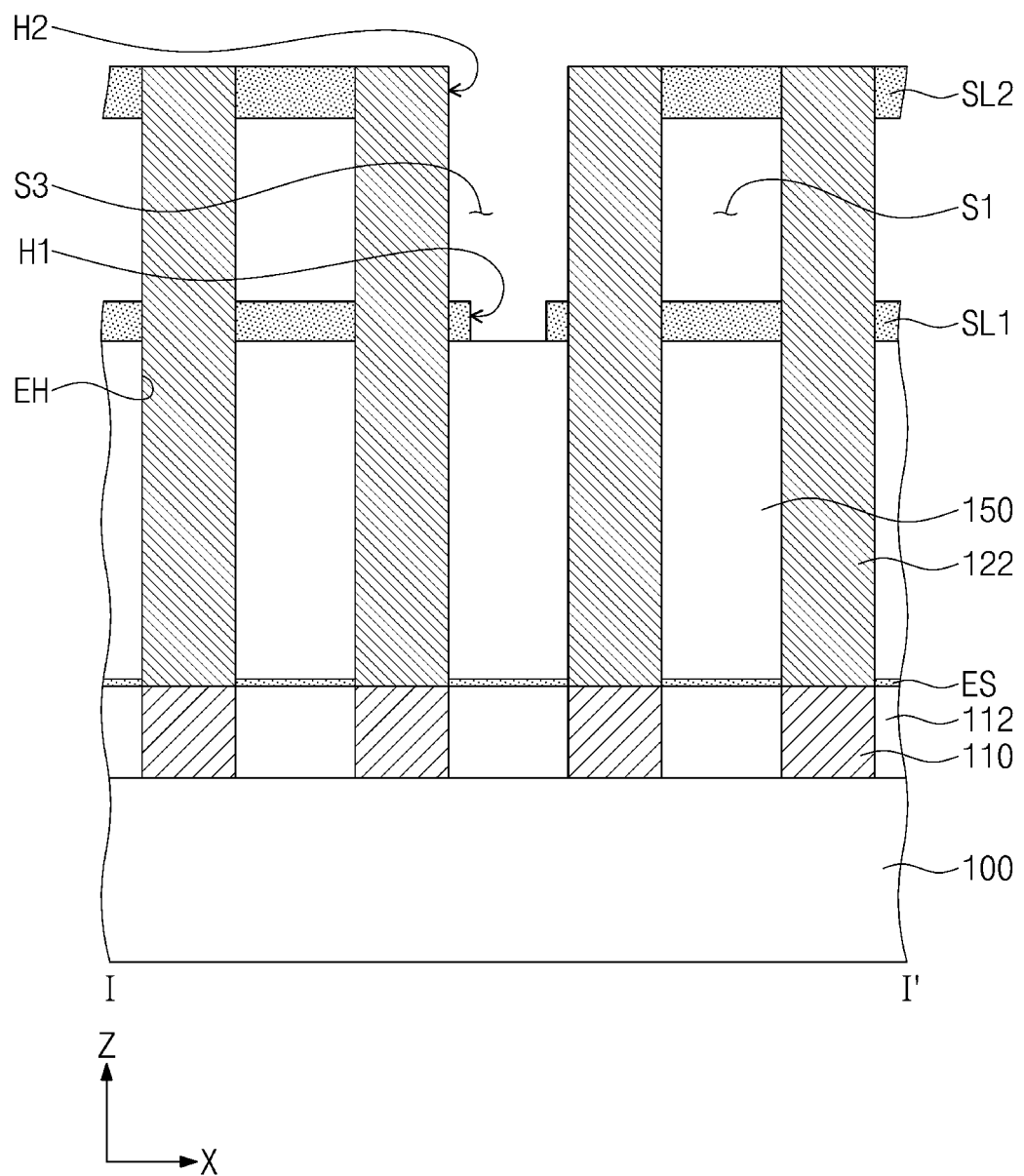

Referring to FIG. 10E, the third mask layer 164 may be removed. Thus, a top surface of the second support pattern SL2 may be exposed. The third mask layer 164 may be removed by, for example, a wet etching process or a dry etching process.

The second mold layer 154 exposed by the second through-holes H2 may be removed by an isotropic etching process. Thus, a bottom surface of the second support pattern SL2 and a top surface of the first support layer 152 may be exposed. In addition, portions of the sidewalls of the lower electrode pillars 122 exposed by the second through-holes H2, and portions of the sidewalls of the lower electrode pillars 122 disposed between the first support layer 152 and the second support pattern SL2 may also be exposed. The second support pattern SL2 and the first support layer 152 may have an etch selectivity with respect to the second mold layer 154, and thus may not be removed when the second mold layer 154 is removed. First spaces S1 and third spaces S3 may be formed by the removal of the second mold layer 154. Each of the first spaces S1 may be defined by the second support pattern SL2 and the first support layer 152 between the lower electrode pillars 122 adjacent to each other. Each of the third spaces S3 may be defined by adjacent lower electrode pillars 122 between the first support layer 152 and each of the second through-holes H2. In other words, each of the third spaces S3 may extend from each of the second through-holes H2 to the top surface of the first support layer 152. The first spaces S1 may expose portions of the sidewalls of the lower electrode pillars 122 disposed between the second support pattern SL2 and the first support layer 152. The third spaces S3 may expose portions of the sidewalls of the lower electrode pillars 122 disposed between the first support layer 152 and the second through-holes H2. The isotropic etching process performed on the second mold layer 154 may use phosphoric acid ($H_3PO_4$).

Portions of the first support layer 152 which vertically overlap with the second through-holes H2 may be etched to form a first support pattern SL1 having first through-holes H1. The first through-holes H1 of the first support pattern SL1 may overlap with the second through-holes H2 of the second support pattern SL2 in the third direction Z. Portions of a top surface of the first mold layer 150 may be exposed by the first through-holes H1.

Figure 10F:
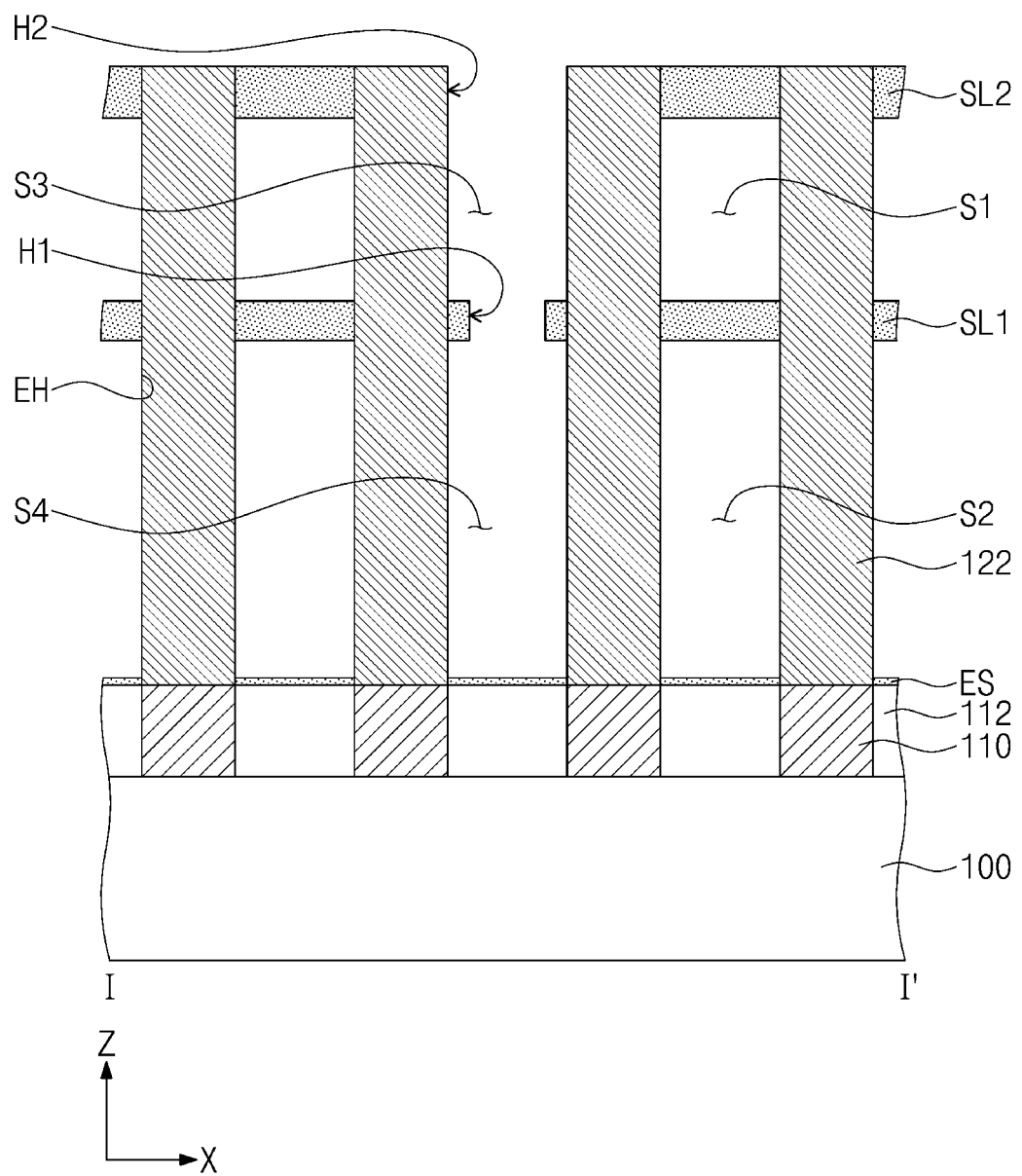

Referring to FIG. 10F, the first mold layer 150 exposed by the first through-holes H1 may be removed by an isotropic etching process. The isotropic etching process performed on the first mold layer 150 may use phosphoric acid ($H_3PO_4$). Second spaces S2 and fourth spaces S4 may be formed by the removal of the first mold layer 150. Each of the second spaces S2 may be defined by the first support pattern SL1 and the top surface of the etch stop layer ES between the lower electrode pillars 122 adjacent to each other. Each of the fourth spaces S4 may be defined by adjacent lower electrode pillars 122 between the etch stop layer ES and each of the first through-holes H1. In other words, each of the fourth spaces S4 may extend from each of the first through-holes H1 toward the top surface of the interlayer insulating layer 112 between the adjacent lower electrode pillars 122. The second spaces S2 may expose portions of the sidewalls of the lower electrode pillars 122 disposed between the top surface of the etch stop layer ES and the bottom surface of the first support pattern SL1. The fourth spaces S4 may expose portions of the sidewalls of the lower electrode pillars 122 disposed between the top surface of the etch stop layer ES and the first through-holes H1. In some embodiments, the etch stop layer ES may not be removed in the isotropic etching process of the first mold layer 150. In some embodiments, the etch stop layer ES may be removed in the isotropic etching process of the first mold layer 150.

Figure 10G:
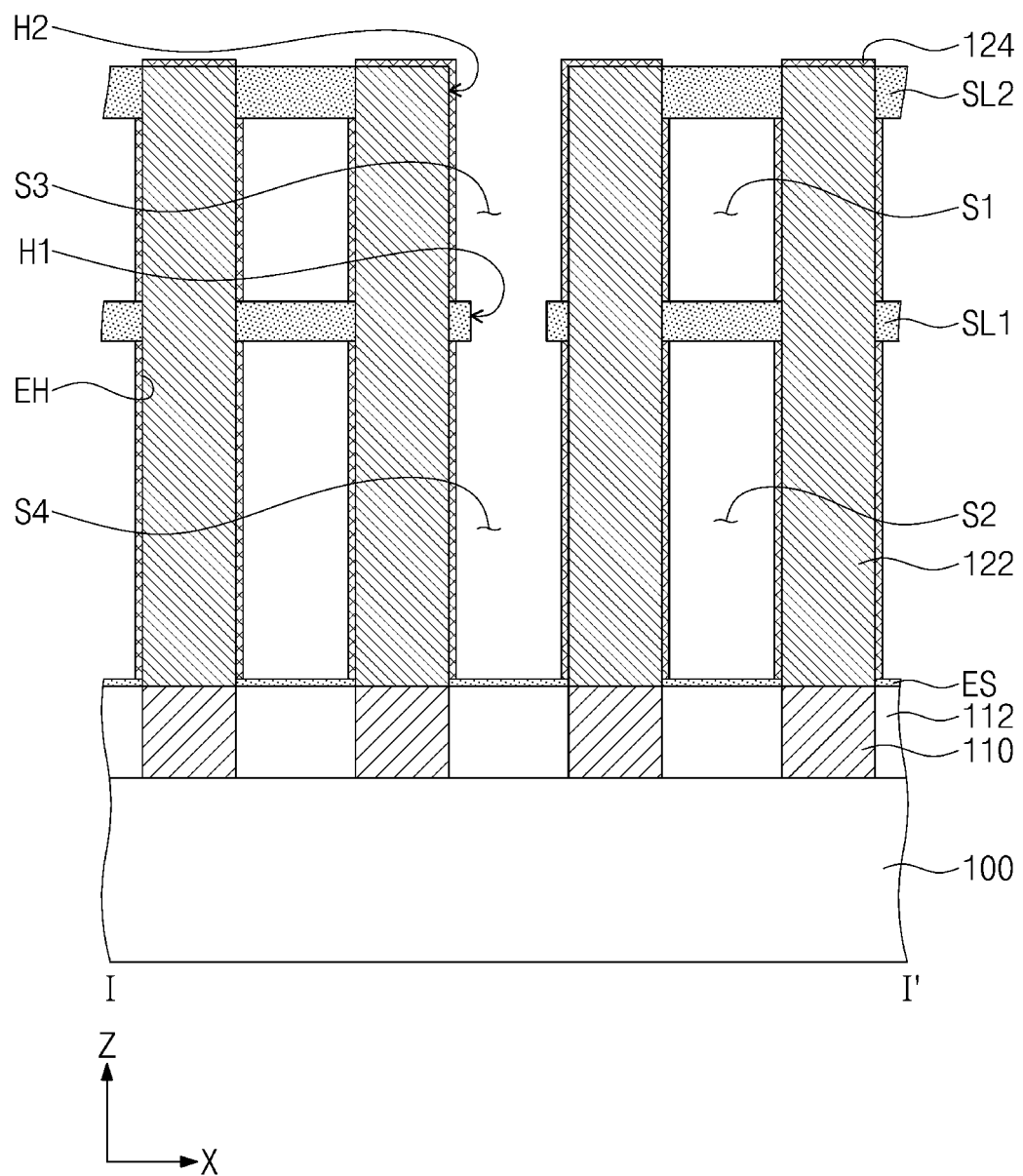

Referring to FIG. 10G, lower electrode patterns 124 may be selectively formed on the sidewalls and the top surfaces of the lower electrode pillars 122, which are exposed by the first and second support patterns SL1 and SL2. A deposition process for forming the lower electrode patterns 124 may include supplying a source gas (e.g., $NH_3$, $N_2$, $O_2$, $O_3$) to adsorb the source gas on the sidewalls and the top surfaces of the lower electrode pillars 122, purging a non-adsorbed source gas, supplying precursors to chemically combine the precursors with the source gas on the sidewalls and the top surfaces of the lower electrode pillars 122, and purging uncombined precursors. The supplying of the source gas, the purging of the non-adsorbed source gas, the supplying of the precursors and the purging of the uncombined precursors may constitute a cycle, and the lower electrode patterns 124 may be formed by repeating the cycle a plurality of times. The precursor may be, for example, a niobium precursor including fluorine. For example, the precursor may be $NbF_5$ or $NbF_{5-x}$. The lower electrode patterns 124 may include a nitride including niobium, an oxide including niobium, or an oxynitride including niobium. For example, the lower electrode patterns 124 may include niobium nitride (NbN)

including fluorine, niobium oxide (NbO) including fluorine, or niobium oxynitride (NbON) including fluorine.

In some embodiments, a formation rate of a layer deposited by the chemical combination of the precursors and the source gas on the sidewalls and the top surfaces of the lower electrode pillars 122 may be greater than a formation rate of a layer deposited by the chemical combination of the precursors and the source gas on surfaces of the first and second support patterns SL1 and SL2 and the etch stop layer ES. Thus, the lower electrode patterns 124 may not be formed on sidewalls and top and bottom surfaces of the first and second support patterns SL1 and SL2 and the top surface of the etch stop layer ES while the lower electrode patterns 124 are formed on the sidewalls and the top surfaces of the lower electrode pillars 122. In some embodiments, metal residual patterns RP (see FIG. 4) may be formed on portions of the surfaces of the etch stop layer ES and the first and second support patterns SL1 and SL2. The metal residual patterns RP may be spaced apart from each other on the top and bottom surfaces and the sidewalls of the first and second support patterns SL1 and SL2 and the top surface of the etch stop layer ES. In other words, the metal residual patterns RP may be formed as a discontinuous layer on the top and bottom surfaces and the sidewalls of the first and second support patterns SL1 and SL2 and the top surface of the etch stop layer ES. The metal residual patterns RP may include the same material as the lower electrode patterns 124. The metal residual patterns RP may include a nitride including niobium. For example, the metal residual patterns RP may include niobium nitride (NbN) including fluorine.

In some embodiments, metal oxide patterns 140 may be formed on the lower electrode patterns 124, as illustrated in FIG. 3. After the formation of the lower electrode patterns 124, a source gas including oxygen (e.g., $O_2$ and/or $O_3$) may be provided to oxidize surfaces of the lower electrode patterns 124, thereby forming the metal oxide patterns 140. The metal oxide patterns 140 may include, for example, niobium oxide (NbO). The metal oxide patterns 140 may include fluorine.

According to some embodiments of the inventive concepts, the lower electrode patterns 124 may be selectively formed on the sidewalls and the top surfaces of the lower electrode pillars 122 by using the niobium precursor including fluorine, a deposition rate of which is changed depending on a surface material. Thus, even though the lower electrode patterns 124 are formed on the substrate 100 having the first and second support patterns SL1 and SL2 after the removal of the first mold layer 150, the lower electrode patterns 124 may not be formed on (i.e., may be absent from) the top and bottom surfaces and the sidewalls of the first and second support patterns SL1 and SL2 and the top surface of the etch stop layer ES or may be formed as a discontinuous layer thereon. As a result, adjacent lower electrode pillars 122 may not be electrically connected to each other by the lower electrode patterns 124. In addition, the lower electrode patterns 124 including fluorine may not be etched when the first and second mold layers 150 and 154 are removed, and thus reliability of the semiconductor device may be improved.

According to some embodiments of the inventive concepts, the lower electrode patterns 124 may be used as a seed layer capable of growing a dielectric layer 130 in a tetragonal structure corresponding to a high-k phase, and thus electrical characteristics of the semiconductor device may be improved.

Figure 10H:
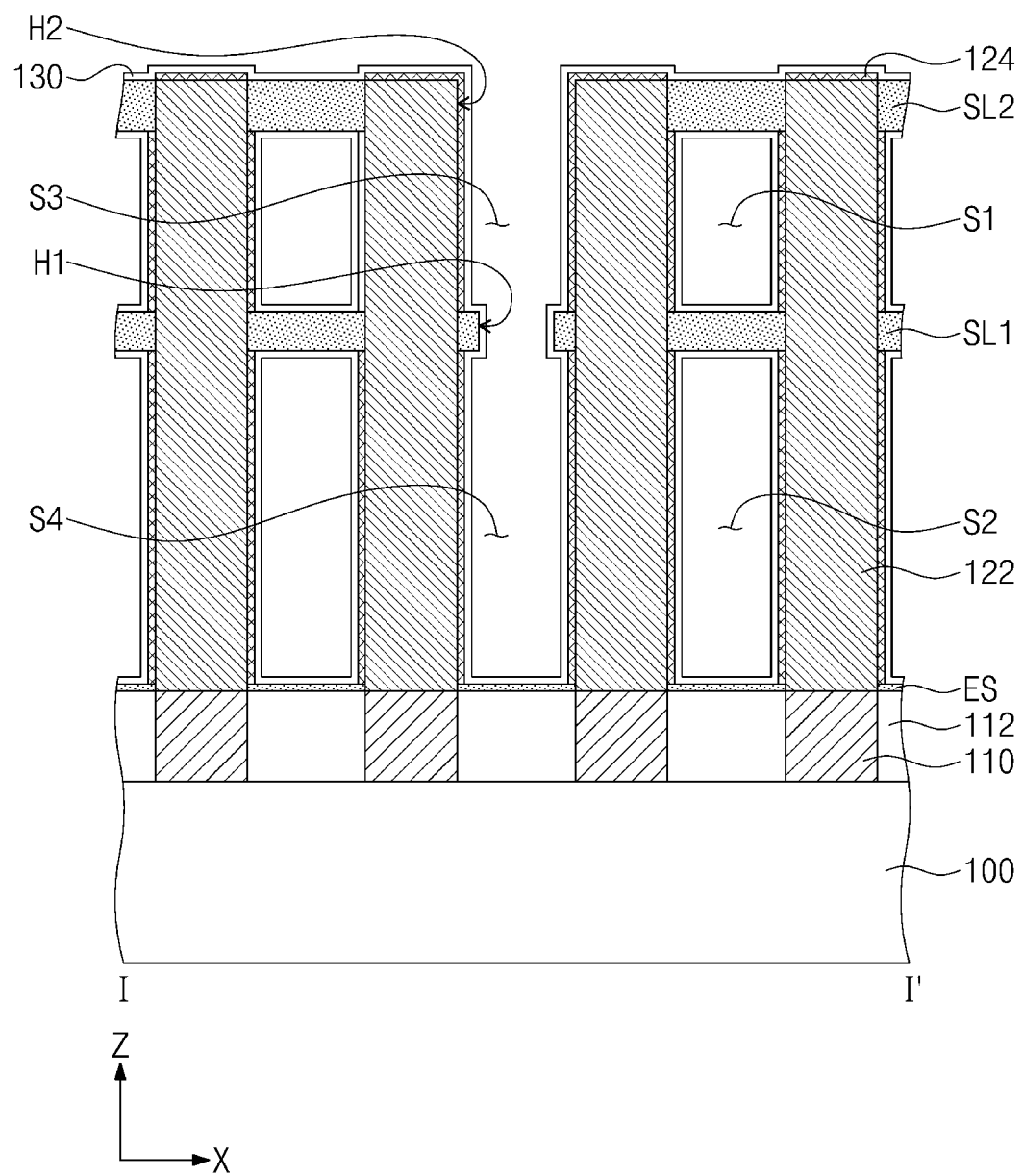

Referring to FIG. 10H, a dielectric layer 130 may be formed to conformally cover top surfaces and sidewalls of the lower electrode patterns 124, the top and bottom surfaces and the sidewalls of the first and second support patterns SL1 and SL2, and the top surface of the etch stop layer ES. The dielectric layer 130 being in contact with the lower electrode patterns 124 may be formed to have the same crystal structure as the lower electrode patterns 124. For example, the dielectric layer 130 may have a tetragonal structure. The dielectric layer 130 may be formed by a layer-formation technique having an excellent property of step coverage, e.g., a CVD technique or an ALD technique. For example, the dielectric layer 130 may be formed of at least one of a metal oxide (e.g., $HfO_2$, $ZrO_2$, $Al_2O_3$, $La_2O_3$, $Ta_2O_3$, or $TiO_2$) or a perovskite dielectric material (e.g., $SrTiO_3$ (STO), (Ba, Sr)$TiO_3$ (BST), $BaTiO_3$, PZT, or PLZT). The dielectric layer 130 may have a single-layer structure or a multi-layer structure.

Referring again to FIG. 2, an upper electrode UE may be formed on the dielectric layer 130. The upper electrode UE may fill the first to fourth spaces S1, S2, S3 and S4 and the first and second through-holes H1 and H2 and may cover a top surface of the dielectric layer 130. The upper electrode UE may be formed of at least one of a semiconductor material doped with dopants, a metal material, a metal nitride, or a metal silicide. In some embodiments, the upper electrode UE may be formed of a refractory metal material such as cobalt, titanium, nickel, tungsten, and/or molybdenum. In some embodiments, the upper electrode UE may be formed of a metal nitride such as titanium nitride (TiN), titanium-aluminum nitride (TiAlN), and/or tungsten nitride (WN). In some embodiments, the upper electrode UE may be formed of at least one of platinum (Pt), ruthenium (Ru), or iridium (Ir).

According to some embodiments of the inventive concepts, a lift-off process of the mold layer may be performed to expose the sidewalls of the lower electrode pillars, and then, the lower electrode patterns may be selectively formed on the sidewalls and the top surfaces of the lower electrode pillars, which are exposed by the support patterns. The lower electrode patterns may not be formed on the surfaces of the support patterns or may be formed as a discontinuous layer on the surfaces of the support patterns. Thus, even though the lower electrode patterns used as portions of lower electrodes are formed after the formation of the support patterns, adjacent lower electrode pillars may not be electrically connected to each other by the lower electrode patterns.

According to some embodiments of the inventive concepts, the lower electrode patterns may be used as a seed layer capable of growing the dielectric layer in the tetragonal structure corresponding to a high-k phase, and thus the electrical characteristics of the semiconductor device may be improved.

While the inventive concepts have been described with reference to example embodiments, it will be apparent to those skilled in the art that various changes and modifications may be made without departing from the scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:
1. A semiconductor device comprising:
a first portion of a lower electrode structure on a substrate;

a first support pattern being in contact with a first portion of a sidewall of the first portion of the lower electrode structure;
a second portion of the lower electrode structure on a second portion of the sidewall of the first portion of the lower electrode structure;
an upper electrode on the second portion of the lower electrode structure and on the first support pattern; and
a dielectric layer between the upper electrode and the second portion of the lower electrode structure,
wherein the first and second portions of the lower electrode structure comprise different respective materials.

2. The semiconductor device of claim 1,
wherein the first portion of the lower electrode structure comprises:
an upper portion protruding upward beyond a top surface of the first support pattern; and
a lower portion at a level between the substrate and the first support pattern, wherein the second portion of the lower electrode structure comprises:
a first lower electrode pattern on a surface of the upper portion; and
a second lower electrode pattern on a surface of the lower portion,
wherein the first lower electrode pattern is physically spaced apart from the second lower electrode pattern by the first support pattern.

3. The semiconductor device of claim 1,
wherein the second portion of the lower electrode structure is in contact with the second portion of the sidewall of the first portion of the lower electrode structure,
wherein the dielectric layer is in contact with the second portion of the lower electrode structure, and
wherein the dielectric layer is in contact with a top surface and a bottom surface of the first support pattern.

4. The semiconductor device of claim 1,
wherein the dielectric layer extends between the upper electrode and a top surface of the first support pattern, between the upper electrode and a bottom surface of the first support pattern, and between the upper electrode and a sidewall of the first support pattern, and
wherein portions of the dielectric layer that are on the top surface, the sidewall, and the bottom surface of the first support pattern have flat surfaces.

5. The semiconductor device of claim 1, further comprising:
metal residual patterns on a top surface, a bottom surface, and a sidewall of the first support pattern,
wherein the metal residual patterns are spaced apart from the second portion of the lower electrode structure, and
wherein the metal residual patterns have hemispherical shapes when viewed in a cross-sectional view.

6. The semiconductor device of claim 1, further comprising:
metal residual patterns on a top surface, a bottom surface, and a sidewall of the first support pattern,
wherein the metal residual patterns are spaced apart from each other.

7. The semiconductor device of claim 1,
wherein the first portion of the lower electrode structure includes a first metal nitride including titanium (Ti), and
wherein the second portion of the lower electrode structure includes a second metal nitride including niobium, a metal oxide including niobium, or a metal oxynitride including niobium.

8. The semiconductor device of claim 1, further comprising:
a metal oxide pattern between the second portion of the lower electrode structure and the dielectric layer,
wherein the metal oxide pattern includes niobium.

9. The semiconductor device of claim 1, wherein the first support pattern includes silicon oxide.

10. The semiconductor device of claim 1, wherein the second portion of the lower electrode structure includes fluorine.

11. The semiconductor device of claim 1, further comprising:
a second support pattern on the first support pattern and being in contact with a third portion of the sidewall of the first portion of the lower electrode structure,
wherein the second support pattern is vertically spaced apart from the first support pattern, and
wherein a top surface of the second support pattern is coplanar with a top surface of the first portion of the lower electrode structure.

12. The semiconductor device of claim 1, further comprising:
a second support pattern on the first support pattern and being in contact with a third portion of the sidewall of the first portion of the lower electrode structure,
wherein the second support pattern is vertically spaced apart from the first support pattern,
wherein an upper portion of the first portion of the lower electrode structure protrudes upward beyond a top surface of the second support pattern, and
wherein the first portion of the lower electrode structure has a constant width.

13. The semiconductor device of claim 1,
wherein the first portion of the lower electrode structure comprises:
a horizontal portion parallel to a top surface of the substrate;
a first vertical portion vertically extending from a first end portion of the horizontal portion; and
a second vertical portion vertically extending from a second end portion of the horizontal portion,
wherein the first vertical portion and the second vertical portion are parallel to each other and are spaced apart from each other, and
wherein the second portion of the lower electrode structure is on a top surface of the horizontal portion, an inner sidewall and a top surface of the first vertical portion, and an inner sidewall and a top surface of the second vertical portion.

14. A semiconductor device comprising:
a lower electrode structure comprising: a first portion on a substrate; and a second portion on a surface of the first portion;
a support pattern on a sidewall of the first portion of the lower electrode structure;
an upper electrode on the lower electrode structure and on the support pattern; and
a dielectric layer between the lower electrode structure and the upper electrode and between the support pattern and the upper electrode,
wherein the second portion of the lower electrode structure includes niobium and fluorine, and
wherein the second portion of the lower electrode structure further includes at least one of oxygen or nitrogen.

15. The semiconductor device of claim 14, wherein the support pattern is in contact with a portion of the sidewall of the first portion of the lower electrode structure.

16. The semiconductor device of claim 14, further comprising:
  metal residual patterns between the support pattern and the dielectric layer,
  wherein the metal residual patterns are spaced apart from each other, and
  wherein the metal residual patterns include the same material as the second portion of the lower electrode structure.

17. The semiconductor device of claim 14, further comprising:
  a metal oxide pattern between the second portion of the lower electrode structure and the dielectric layer,
  wherein the metal oxide pattern includes niobium.

18. The semiconductor device of claim 14,
  wherein the second portion of the lower electrode structure is in contact with the dielectric layer and with the surface of the first portion of the lower electrode structure, and
  wherein the first portion of the lower electrode structure is physically spaced apart from the dielectric layer by the second portion of the lower electrode structure.

19. The semiconductor device of claim 14,
  wherein the lower electrode structure comprises:
    an upper region horizontally overlapping with the support pattern; and
    a lower region between the upper region and the substrate and not horizontally overlapping with the support pattern, and
  wherein a width of the upper region is less than a width of the lower region.

20. A semiconductor device comprising:
  a lower electrode structure comprising: a first conductive portion on a substrate; and a second conductive portion on a surface of the first conductive portion;
  a support pattern contacting a sidewall of the lower electrode structure, wherein the second conductive portion of the lower electrode structure is absent from a surface of the support pattern or is discontinuous on the surface of the support pattern;
  an upper electrode on the lower electrode structure and on the support pattern; and
  a dielectric layer between the lower electrode structure and the upper electrode and between the support pattern and the upper electrode,
  wherein the second conductive portion of the lower electrode structure includes niobium, and
  wherein the dielectric layer and the second conductive portion of the lower electrode structure each have a tetragonal structure.

* * * * *